US012809259B2

(12) United States Patent
Lee et al.

(10) Patent No.: US 12,809,259 B2
(45) Date of Patent: Nov. 24, 2026

(54) UNDERLAYER COMPOSITION FOR PHOTOLITHOGRAPHY, MULTILAYERED STRUCTURE FORMED USING THE SAME, AND METHOD OF MANUFACTURING SEMICONDUCTOR DEVICE USING THE SAME

(71) Applicant: Inha University Research and Business Foundation, Incheon (KR)

(72) Inventors: Jinkyun Lee, Incheon (KR); Yejin Ku, Incheon (KR); Jihoon Woo, Incheon (KR)

(73) Assignee: Inha University Research and Business Foundation, Incheon (KR)

( * ) Notice: Subject to any disclaimer, the term of this patent is extended or adjusted under 35 U.S.C. 154(b) by 905 days.

(21) Appl. No.: 18/156,580

(22) Filed: Jan. 19, 2023

(65) Prior Publication Data

US 2024/0027910 A1 Jan. 25, 2024

(30) Foreign Application Priority Data

Jul. 15, 2022 (KR) ........................ 10-2022-0087787

(51) Int. Cl.
*G03F 7/11* (2006.01)
*C08F 212/14* (2006.01)
(Continued)

(52) U.S. Cl.
CPC .............. *G03F 7/11* (2013.01); *C08F 212/24* (2020.02); *C08F 220/14* (2013.01);
(Continued)

(58) Field of Classification Search
CPC .......... G03F 7/11; G03F 7/091; G03F 7/2059; G03F 7/2004; G03F 7/004; G03F 7/0755; G03F 7/092; C08F 212/24; C08F 220/14; C08F 2810/30; C08F 8/00; C08F 8/42; C08F 210/02; C08F 212/08; C08F 212/10; C08F 212/22; C08F 216/14; C08F 220/06;
(Continued)

(56) References Cited

U.S. PATENT DOCUMENTS

| | | | |
|---|---|---|---|
| 8,809,111 | B2 | 8/2014 | Ober et al. |
| 8,846,301 | B2 | 9/2014 | Ober et al. |

(Continued)

FOREIGN PATENT DOCUMENTS

| | | | |
|---|---|---|---|
| CN | 1486449 | A | 3/2004 |
| CN | 101080669 | A | 11/2007 |

(Continued)

OTHER PUBLICATIONS

Alexander A. Zakhidov et al., "Hydrofluoroethers as Orthogonal Solvents for the Chemical Processing of Organic Electronic Materials", Adv. Mater., No. 20, pp. 3481-3484 (2008).

(Continued)

*Primary Examiner* — Caleen O Sullivan
(74) *Attorney, Agent, or Firm* — Harness, Dickey & Pierce, P.L.C.

(57) ABSTRACT

A underlayer composition for photolithography includes a copolymer, wherein the copolymer includes a first repeating unit having a first functional group. The first functional group is represented by one of Chemical Formulas 1 to 4.

15 Claims, 10 Drawing Sheets

(51) Int. Cl.

| | |
|---|---|
| ***C08F 220/14*** | (2006.01) |
| ***C09D 125/18*** | (2006.01) |
| ***C09D 133/12*** | (2006.01) |
| ***H10P 76/20*** | (2026.01) |

(52) U.S. Cl.

CPC ......... *C09D 125/18* (2013.01); *C09D 133/12* (2013.01); *H10P 76/2041* (2026.01); *C08F 2810/30* (2013.01)

(58) Field of Classification Search

CPC .............. C08F 220/281; C08F 220/282; C08F 220/302; C08F 220/58; C08F 226/02; C09D 125/18; C09D 133/12; H10P 76/2041

USPC .................................... 430/272.1, 273.1, 311

See application file for complete search history.

(56) References Cited

U.S. PATENT DOCUMENTS

| | | | | |
|---|---|---|---|---|
| 8,871,545 | B2 | 10/2014 | Lee et al. | |
| 9,213,238 | B2 | 12/2015 | Ober et al. | |
| 9,214,345 | B2 | 12/2015 | Ohashi et al. | |
| 9,259,759 | B2 | 2/2016 | Ober et al. | |
| 9,389,511 | B2 | 7/2016 | Schwartz et al. | |
| 9,500,952 | B2 | 11/2016 | Ober et al. | |
| 9,994,754 | B2 | 6/2018 | Clough | |
| 11,460,767 | B2 | 10/2022 | Komatsu et al. | |
| 2002/0058204 | A1* | 5/2002 | Khojasteh | G03F 7/0395 430/323 |
| 2004/0219454 | A1* | 11/2004 | Foster | B41C 1/1008 430/270.1 |
| 2017/0045819 | A1* | 2/2017 | Karasawa | C08F 220/14 |
| 2020/0041901 | A1 | 2/2020 | Namgung et al. | |
| 2020/0073240 | A1* | 3/2020 | Hoshino | C08F 220/22 |
| 2020/0124963 | A1* | 4/2020 | Kaneko | C08F 212/22 |
| 2021/0011383 | A1 | 1/2021 | Cardineau et al. | |
| 2021/0054231 | A1 | 2/2021 | Shibayama et al. | |
| 2021/0109442 | A1 | 4/2021 | Moon et al. | |
| 2021/0269666 | A1* | 9/2021 | Ota | C09D 7/70 |
| 2023/0106223 | A1* | 4/2023 | Huang | C08G 65/336 524/91 |

FOREIGN PATENT DOCUMENTS

| | | | |
|---|---|---|---|
| CN | 113495429 | A | 10/2021 |
| JP | 2001-188349 | A | 7/2001 |
| JP | 2002-006491 | A | 1/2002 |
| JP | 2002-348332 | A | 12/2002 |
| JP | 2005-221714 | A | 8/2005 |
| JP | 2020-123366 | A | 8/2020 |
| KR | 10-2016-0141766 | A | 12/2016 |
| KR | 101926739 | B1 | 12/2018 |
| KR | 10-2019-0024952 | A | 3/2019 |
| KR | 10-2019-0060664 | A | 6/2019 |
| KR | 10-2020-0098595 | A | 8/2020 |
| KR | 10-2021-0005570 | A | 1/2021 |
| KR | 10-2021-0036204 | A | 4/2021 |
| KR | 10-2022-0035149 | A | 3/2022 |
| KR | 10-2022-0131090 | A | 9/2022 |
| WO | WO-2019/124514 | A1 | 6/2019 |

OTHER PUBLICATIONS

Okimoto, Yoshio et al., "Development of a Highly Efficient Catalytic Method for Synthesis of Vinyl Ethers," Journal of the American Chemical Society, vol. 124, No. 8, pp. 11590-1591 (2002). <http://www.123rf.com/photo_885384_olive-oil-in-non-stick-pan.html>.

Ming et al., "Synthesis of a novel vinyl ether functionalized resin and its application in negative photoresist," Journal of Nanjing University, vol. 46, No. 1, Jan. 2010.

* cited by examiner

| Forming pattern by extreme ultraviolet irradiation | | |
|---|---|---|
| Underlayer | X | VTMS |
| Pattern image |  |  |
| Dimension | 12nm HP pattern | |
| Dose | 106.8mJ/$cm^2$ | |

| Forming pattern by extreme ultraviolet irradiation | | |
|---|---|---|
| Underlayer | X | DVS |
| Pattern image |  |  |
| Dimension | 24nm HP pattern | |
| Dose | 114mJ/$cm^2$ | |

UNDERLAYER COMPOSITION FOR PHOTOLITHOGRAPHY, MULTILAYERED STRUCTURE FORMED USING THE SAME, AND METHOD OF MANUFACTURING SEMICONDUCTOR DEVICE USING THE SAME

CROSS-REFERENCE TO RELATED APPLICATIONS

This U.S. non-provisional patent application claims priority under 35 U.S.C. § 119 to Korean Patent Application No. 10-2022-0087787, filed on Jul. 15, 2022, in the Korean Intellectual Property Office, the entire contents of which are hereby incorporated by reference.

BACKGROUND OF THE INVENTION

The inventive concept relates to an underlayer composition for photolithography used for manufacturing a semiconductor device, a multilayer structure formed using the same, and a method of manufacturing a semiconductor device using the same.

Photolithography may include an exposure process and a developing process. Performing the exposure process may include irradiating light of a specific wavelength to a resist layer to induce a change in a chemical structure of the resist layer. Performing the developing process may include selectively removing an exposed portion or an unexposed portion of the resist layer, by using a solubility difference between the exposed portion and the unexposed portion of the resist layer.

Recently, as a semiconductor device is highly integrated and miniaturized, a critical dimension of patterns in the semiconductor device becomes fine. For a formation of fine patterns, various studies are conducted to suppress collapse of a resist pattern while improving resolution and sensitivity of the resist pattern formed by the photolithography.

SUMMARY

An embodiment of the inventive concept provides an underlayer composition capable of improving resolution and sensitivity of a resist pattern and suppressing collapse of a resist pattern, a multilayer structure formed using the same, and a method of manufacturing a semiconductor device using the same.

The problem to be solved by the inventive concept is not limited to the problems mentioned above, and other problems not mentioned will be clearly understood by those skilled in the art from the following description.

According to embodiments of the inventive concept, an underlayer composition for photolithography may include a copolymer, and the copolymer may include a first repeating unit having a first functional group. The first functional group is represented by one of Chemical Formulas 1 to 4.

[Chemical Formula 1]

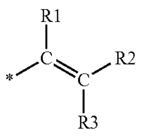

-continued

[Chemical Formula 2]

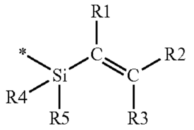

[Chemical Formula 3]

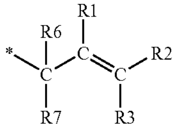

[Chemical Formula 4]

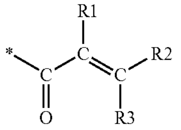

In Chemical Formulas 1 to 4, "R1", "R2", "R3", "R4", "R5", "R6", and "R7" are each independently hydrogen, deuterium, or an alkyl group having 1 to 3 carbon atoms, and "*" is a part bonded to the first repeating unit of the copolymer.

According to embodiments of the inventive concept, a multilayered structure may include a lower layer, an underlayer on the lower layer, and a photoresist layer on the underlayer. The photoresist layer may include a fluorinated alkyl group. The underlayer may include a monomolecule having a vinyl group ($—CH{=}CH_2$), or a copolymer having a first functional group. The first functional group is represented by one of Chemical Formulas 1 to 4 above-described.

According to embodiments of the inventive concept, a method of manufacturing a semiconductor device may include forming an underlayer on a lower layer and forming a photoresist layer on the underlayer. The forming of the underlayer may include applying an underlayer composition on the lower layer. The forming of the photoresist layer may include applying a resist composition containing a fluorinated alkyl group on the underlayer using a fluorine-based solvent. The underlayer composition may include a monomolecule having a vinyl group ($—CH{=}CH_2$), or a copolymer having a first functional group. The first functional group is represented by one of Chemical Formulas 1 to 4 above-described.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
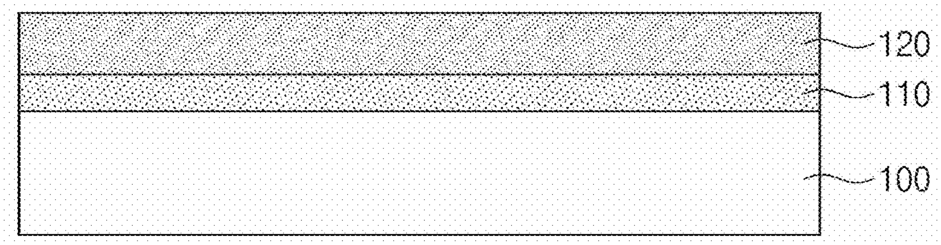
FIGS. 1 to 4 are cross-sectional views illustrating a method of manufacturing a semiconductor device according to embodiments of the inventive concept.

In order to fully understand the configuration and effects of the inventive concept, preferred embodiments of the inventive concept will be described with reference to the accompanying drawings. However, the inventive concept is not limited to the embodiments disclosed below, and may be embodied in various forms and various modifications may be made. However, it is provided so that the disclosure of the inventive concept is complete through the description of the present embodiments, and to fully inform those of ordinary skill in the art to which the inventive concept, the scope of the inventive concept. Those of ordinary skill in the art will understand that the inventive concept may be practiced in any suitable environment.

The terminology used herein is for the purpose of describing the embodiments and is not intended to limit the inventive concept. As used herein, the singular also includes the plural unless specifically stated otherwise in the phrase. As used herein, 'comprises' and/or 'comprising' refers to a referenced material, component, step, operation and/or element being one or more other substances, components, steps, operations and/or elements, or the presence or addition of elements.

Herein, an alkyl group may be a linear alkyl group, a branched alkyl group, or a cyclic alkyl group. The number of carbon atoms in the alkyl group is not particularly limited, but may be an alkyl group having 1 to 3 carbon atoms. Examples of the alkyl group include, but are not limited to, a methyl group, an ethyl group, and a propyl group.

Herein, a halogen group may include, for example, fluorine (F), chlorine (CI), bromine (Br), and iodine (I), but is not limited thereto.

Hereinafter, embodiments of the inventive concept will be described in detail with reference to the accompanying drawings. The same reference numerals are used for the same components in the drawings, and duplicate descriptions thereof are omitted.

An Underlayer Composition According to Embodiments of the Inventive Concept is Described.

According to embodiments of the inventive concept, an underlayer composition may be used for manufacturing a semiconductor device, and may be used for a photolithography process for the manufacturing of the semiconductor device. The underlayer composition may be used, for example, in an extreme ultraviolet or e-beam lithography process. Extreme ultraviolet may refer to ultraviolet having a wavelength of 10 nm to 124 nm, specifically, a wavelength of 13.0 nm to 13.9 nm, and more specifically, a wavelength of 13.4 nm to 13.6 nm.

According to some embodiments, the underlayer composition may include a monomolecule having a vinyl group ($-CH=CH_2$). For example, the monomolecule may include a vinyl group ($\equiv Si-CH=CH_2$) bonded to a silicon atom. The monomolecule may include at least one of vinyldisilazane, vinylchlorosilane, and vinyloxysilane. The monomolecule may include, for example, at least one selected from the group consisting of 1,3-divinyltetramethyldisilazane (DVS), vinyltrimethoxysilane (VTMS), vinyltrimethoxysilane, vinyltrichlorosilane, vinylmethyldichlorosilane, vinyldimethylchlorosilane, tris(2-methoxyethoxy)(vinyl)silane, 3-(methacryloyloxy)propyltrimethoxysilane, 3-(acryloyloxy)propyltrimethoxysilane, trimethoxy(4-vinylphenyl)silane, 3-methacryloyloxy)propylmethyldiethoxysilane, and 3-(methacryloyloxy)propylmethyldiethoxysilane.

According to some embodiments, the underlayer composition may include a copolymer, and the copolymer may include a first repeating unit having a first functional group. The first functional group may be represented by one of Chemical Formulas 1 to 4.

[Chemical Formula 1]

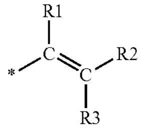

[Chemical Formula 2]

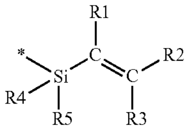

[Chemical Formula 3]

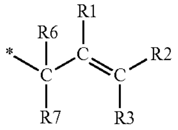

[Chemical Formula 4]

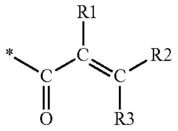

In Chemical Formulas 1 to 4, "R1", "R2", "R3", "R4", "R5", "R6", and "R7" are each independently hydrogen, deuterium, or an alkyl group having 1 to 3 carbon atoms, and "*" is a part bonded to the first repeating unit of the copolymer.

For example, Chemical Formula 1 may include a functional group represented by Chemical Formula 1-1.

[Chemical Formula 1-1]

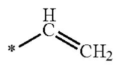

For example, Chemical Formula 2 may include a functional group represented by Chemical Formula 2-1.

[Chemical Formula 2-1]

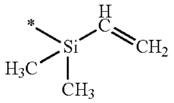

For example, Chemical Formula 3 may include a functional group represented by Chemical Formula 3-1.

[Chemical Formula 3-1]

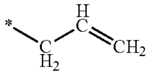

For example, Chemical Formula 4 may include a functional group represented by Chemical Formula 4-1 or Chemical Formula 4-2.

[Chemical Formula 4-1]

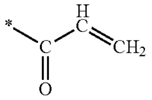

[Chemical Formula 4-2]

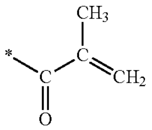

The first repeating unit may include a structure represented by one of Chemical Formulas 5-1 to 5-20. in the following Chemical Formulas 5-1 to 5-20, “M” is the first functional group. In the following Chemical Formulas 5-1 to 5-20, when a chemical bond is not drawn at a position where a chemical bond is to be drawn, it may mean that a hydrocarbon group is bonded to the position.

TABLE 1

| | |
|---|---|
| 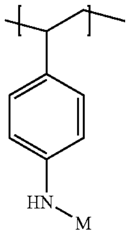 | [Chemical Formula 5-1] |
| 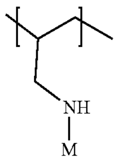 | [Chemical Formula 5-2] |

TABLE 1-continued

| | |
|---|---|
| 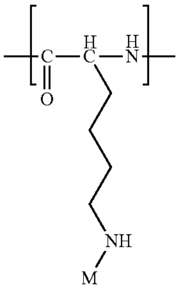 | [Chemical Formula 5-3] |
| 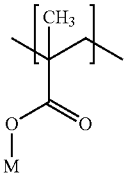 | [Chemical Formula 5-4] |
| 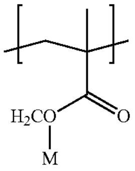 | [Chemical Formula 5-5] |
| 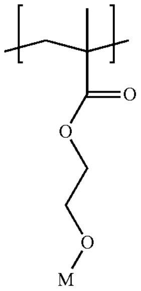 | [Chemical Formula 5-6] |
| 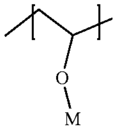 | [Chemical Formula 5-7] |
| 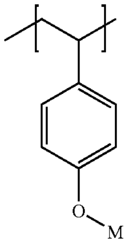 | [Chemical Formula 5-8] |
| 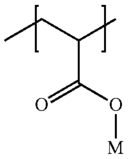 | [Chemical Formula 5-9] |

TABLE 1-continued

[Chemical Formula 5-10]

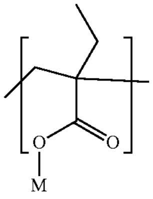

[Chemical Formula 5-11]

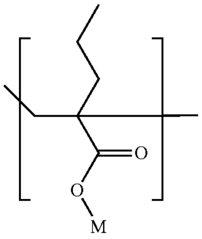

[Chemical Formula 5-12]

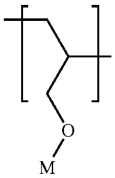

[Chemical Formula 5-13]

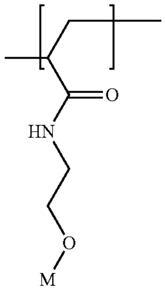

[Chemical Formula 5-14]

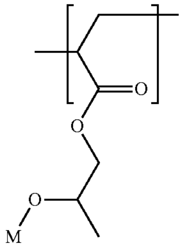

[Chemical Formula 5-15]

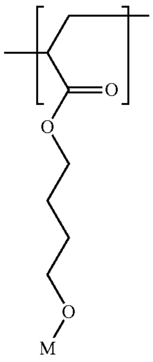

TABLE 1-continued

[Chemical Formula 5-16]

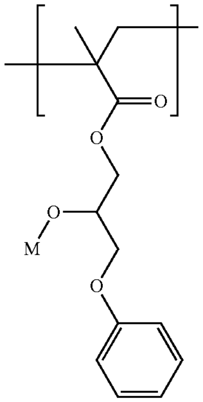

[Chemical Formula 5-17]

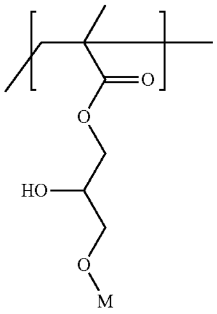

[Chemical Formula 5-18]

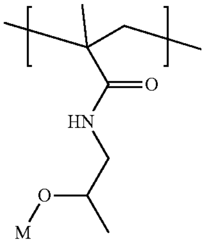

[Chemical Formula 5-19]

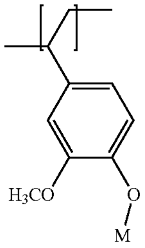

[Chemical Formula 5-20]

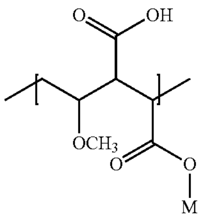

The copolymer may further include a second repeating unit having a second functional group. The second functional group may be one of —NH—, —OH, $-OCH_3$, —COOH, and —SH. The first repeating unit may be derived from the same monomer as the second repeating unit. The first repeating unit may have a structure in which hydrogen of the second functional group of the second repeating unit is substituted with the first functional group. The second repeating unit may include a structure represented by one of Chemical Formulas 6-1 to 6-20. In the following Chemical Formulas 6-1 to 6-20, when a chemical bond is not drawn at a position where a chemical bond is to be drawn, it may mean that a hydrocarbon group is bonded to the position.

TABLE 2

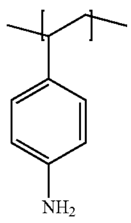

[Chemical Formula 6-1]

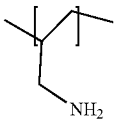

[Chemical Formula 6-2]

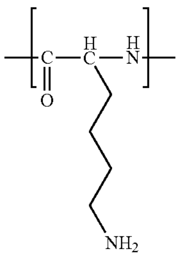

[Chemical Formula 6-3]

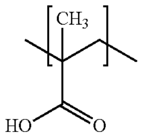

[Chemical Formula 6-4]

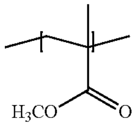

[Chemical Formula 6-5]

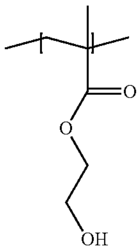

[Chemical Formula 6-6]

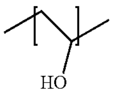

[Chemical Formula 6-7]

TABLE 2-continued

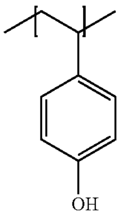

[Chemical Formula 6-8]

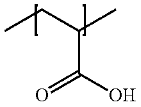

[Chemical Formula 6-9]

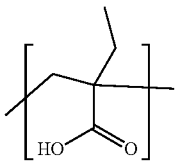

[Chemical Formula 6-10]

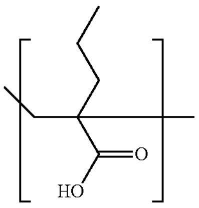

[Chemical Formula 6-11]

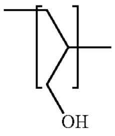

[Chemical Formula 6-12]

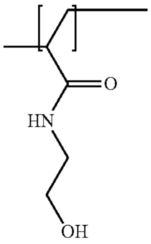

[Chemical Formula 6-13]

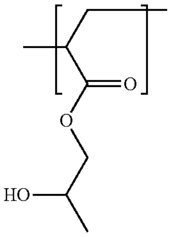

[Chemical Formula 6-14]

TABLE 2-continued

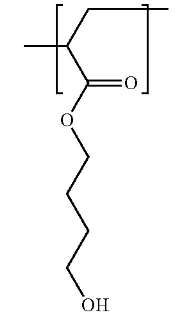

[Chemical Formula 6-15]

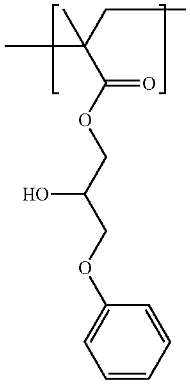

[Chemical Formula 6-16]

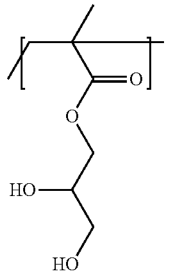

[Chemical Formula 6-17]

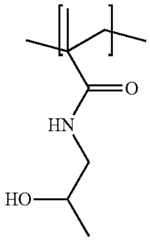

[Chemical Formula 6-18]

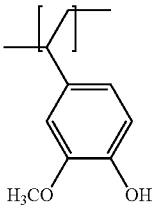

[Chemical Formula 6-19]

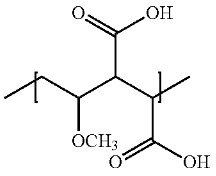

[Chemical Formula 6-20]

TABLE 2-continued

The copolymer may further include a third repeating unit different from the first repeating unit and the second repeating unit. The third repeating unit may be derived from a monomer different from the first repeating unit and the second repeating unit. For example, the first repeating unit and the second repeating unit may be derived from a first monomer, and the third repeating unit may be derived from a second monomer different from the first monomer. The third repeating unit may include a structure represented by one of Chemical Formulas 7-1 to 7-4. In the following Chemical Formulas 7-1 to 7-4, when a chemical bond is not drawn at a position where a chemical bond is to be drawn, it may mean that a hydrocarbon group is bonded to the position.

TABLE 3

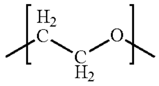

[Chemical Formula 7-1]

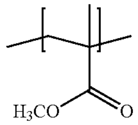

[Chemical Formula 7-2]

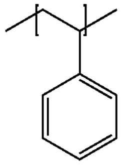

[Chemical Formula 7-3]

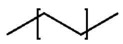

[Chemical Formula 7-4]

The copolymer may include the structure of Chemical Formula 8.

$$-(A)_x-(A')_y-(B)_z- \quad \text{[Chemical Formula 8]}$$

“A” may be the first repeating unit, “A'” may be the second repeating unit, and “B” may be the third repeating unit. “x”, “y” and “z” may represent a ratio between the first to third repeating units. As an example, a ratio of “(x+y)” to “z” may be in a range of 40:60 to 60:40. For example, a ratio of “x” to “y” may be in a range of 90:10 to 30:70.

The first repeating unit may have a structure in which hydrogen of the second functional group of the second repeating unit is substituted with the first functional group. Hereinafter, exemplary methods in which the first functional group is introduced into the second functional group will be described with reference to Chemical equations 1-1 to 1-6. In the Chemical equations 1-1 to 1-6, when a chemical bond is not drawn at a position where a chemical bond is to be drawn, it may mean that a hydrocarbon group is bonded to the position.

[Chemical equation 1-1]

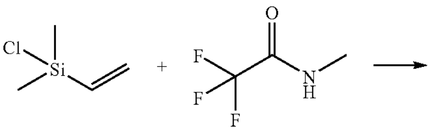

-continued

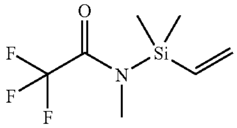

[Chemical equation 1-2]

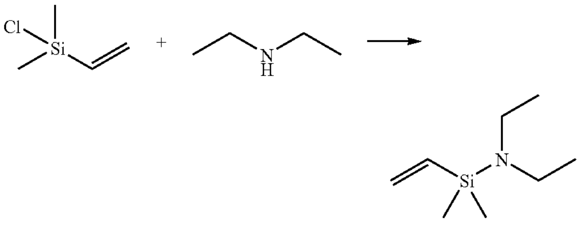

[Chemical equation 1-3]

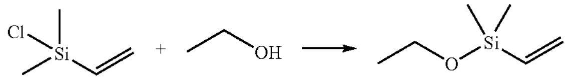

[Chemical equation 1-4]

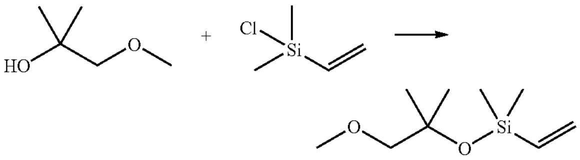

[Chemical equation 1-5]

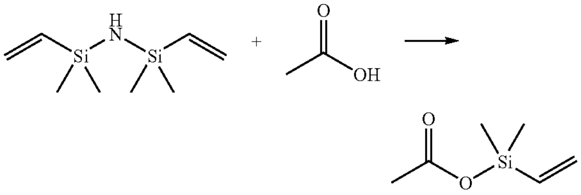

[Chemical equation 1-6]

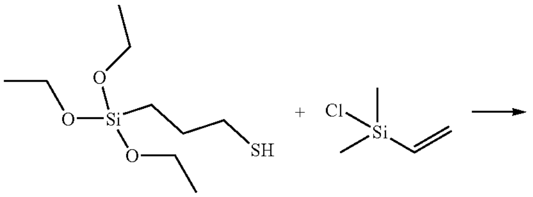

-continued

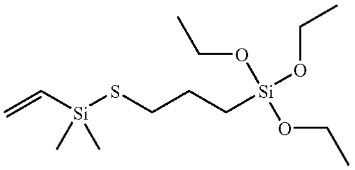

In a case of a compound containing a chemical bond of a hetero element and hydrogen, a silylvinyl functional group may be introduced into a molecular structure of the compound through a silylation reaction using vinylchlorosilane and a weakly basic reagent as in Chemical equations 1-1 to 1-4 and Chemical equation 1-6, or a substitution reaction using vinyldisilazane as in Chemical equation 1-5.

The copolymer represented by Chemical Formula 8 may include at least one of materials represented by Chemical Formulas 8-1 to 8-5. In the following Chemical Formulas 8-1 to 8-5, when a chemical bond is not drawn at a position where a chemical bond is to be drawn, it may mean that a hydrocarbon group is bonded to the position.

[Chemical Formula 8-1]

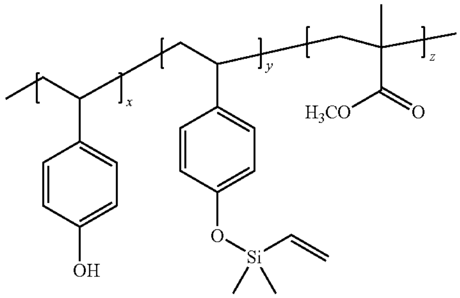

[Chemical Formula 8-2]

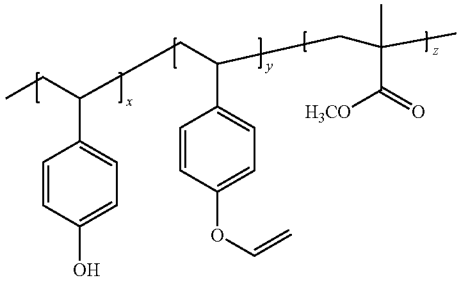

[Chemical Formula 8-3]

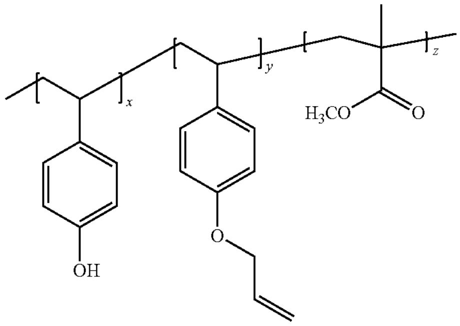

-continued

[Chemical Formula 8-4]

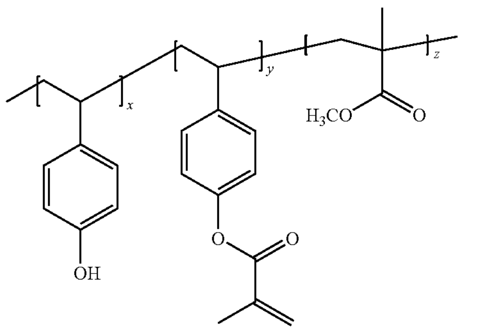

[Chemical Formula 8-5]

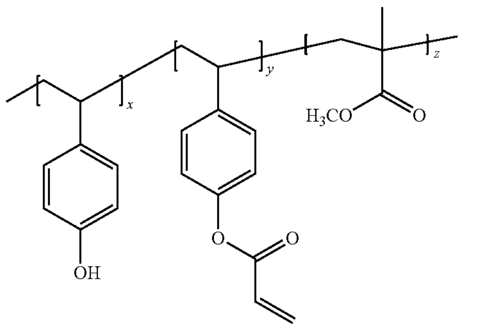

Synthesis of the copolymer represented by Chemical Formula 8-1 may proceed as in Chemical equation 2 and Synthesis Examples 1 to 3. In the Chemical equation 2 below, when a chemical bond is not drawn at a position where a chemical bond is to be drawn, it may mean that a hydrocarbon group is bonded to the position.

[Chemical equation 2]

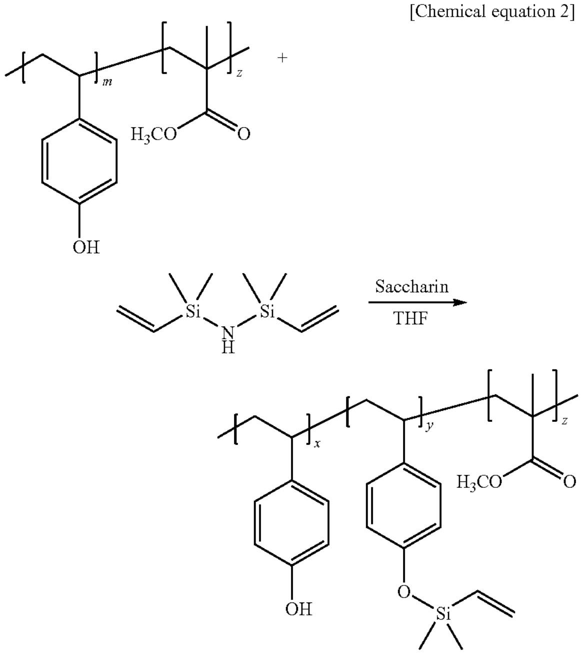

Synthesis Example 1

Poly(4-hydroxystyrene-co-methyl methacrylate) 1000 mg, Saccharin 1 mg, 1,3-divinyltetramethyldisilazane (DVS) 210 mg, and tetrahydrofuran 6 $cm^3$ are put into a high-pressure reaction vessel (Seal tube, 25 $cm^3$) to form a mixture. By stirring the mixture at a temperature of 55° C. for 18 hours, a reaction according to Chemical equation 2 proceeds. Thereafter, a solution in the reaction vessel is added dropwise to 120 $cm^3$ of hexane to form a precipitate. By filtering and drying the precipitate, a copolymer represented by Chemical Formula 8-1 (a ratio of "x" to "y" is about 83:17) as a final product is obtained.

Synthesis Example 2

Poly(4-hydroxystyrene-co-methyl methacrylate) 1000 mg, Saccharin 3.1 mg, 1,3-divinyltetramethyldisilazane (DVS) 632 mg, and tetrahydrofuran 6 $cm^3$ are put into a high-pressure reaction vessel (Seal tube, 25 $cm^3$) to form a mixture. By stirring the mixture at a temperature of 55° C. for 18 hours, a reaction according to Chemical equation 2 proceeds. Thereafter, a solution in the reaction vessel is added dropwise to 120 $cm^3$ of methanol to form a precipitate. By filtering and drying the precipitate, a copolymer represented by Chemical Formula 8-1 (a ratio of "x" to "y" is about 61:39) as a final product is obtained.

Synthesis Example 3

Poly(4-hydroxystyrene-co-methyl methacrylate) 1000 mg, Saccharin 2.1 mg, 1,3-divinyltetramethyldisilazane (DVS) 420 mg, and tetrahydrofuran 6 $cm^3$ are put into a high-pressure reaction vessel (Seal tube, 25 $cm^3$) to form a mixture. By stirring the mixture at a temperature of 55° C. for 18 hours, a reaction according to Chemical equation 2 proceeds. Thereafter, a solution in the reaction vessel is added dropwise to 120 $cm^3$ of hexane to form a precipitate. By filtering and drying the precipitate, the copolymer represented by Chemical Formula 8-1 (a ratio of "x" to "y" is about 33:67) as a final product is obtained.

Synthesis of the copolymer represented by Chemical Formula 8-2 may proceed as illustrated in Chemical equation 3. In the Chemical equation 3 below, when a chemical bond is not drawn at a position where a chemical bond should be drawn, it may mean that a hydrocarbon group is bonded to the position.

[Chemical equation 3]

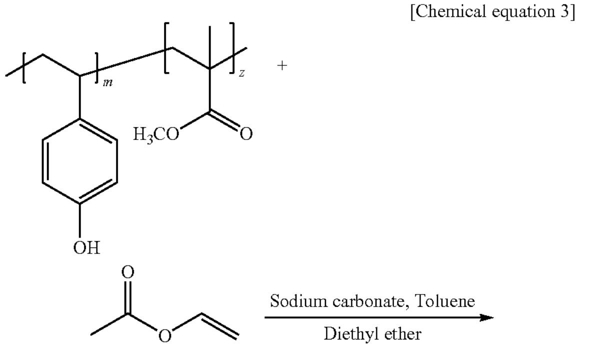

-continued

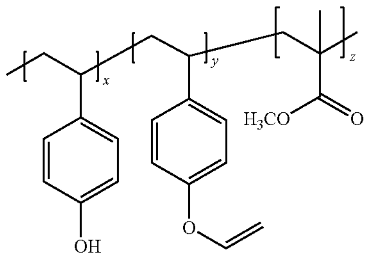

In the case of a compound containing a chemical bond between a hetero element and hydrogen, a vinyl functional group may be introduced into a molecular structure of the compound through a substitution reaction using vinyl acetate and a basic reagent as illustrated in Chemical equation 3.

Synthesis of the copolymer represented by Chemical Formula 8-3 may proceed as illustrated in Chemical equation 4. The copolymer represented by Chemical Formula 8-3 may be formed through a general Williamson ether synthesis reaction using allyl bromide or allyl chloride. In the Chemical equation 4, when a chemical bond is not drawn at a position where a chemical bond is to be drawn, it may mean that a hydrocarbon group is bonded to the position.

[Chemical equation 4]

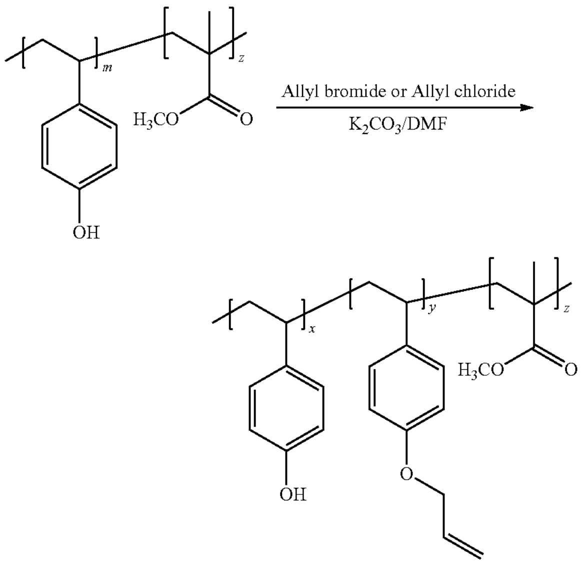

(In Chemical Equation 4, DMF is Dimethylformamide.)

Synthesis of the copolymer represented by Chemical Formula 8-4 or Chemical Formula 8-5 may proceed as illustrated in Chemical equation 5. In the Chemical equation 5 below, when a chemical bond is not drawn at a position where a chemical bond is to be drawn, it may mean that a hydrocarbon group is bonded to the position.

[Chemical equation 5]

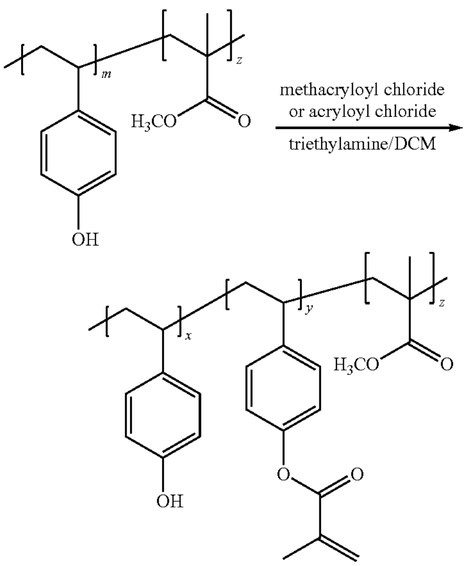

or

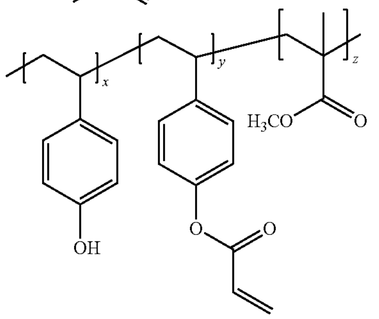

(In Chemical Equation 5, DCM is Dichloromethane.)

In the case of a compound containing a chemical bond of a hetero element and hydrogen, as illustrated in Chemical equation 5, an acryl or methacryl functional group may be introduced into a molecular structure of the compound through a substitution reaction using acryloyl chloride or methacryloyl chloride, and a basic reagent.

A Method of Manufacturing a Semiconductor Device Using a Underlayer Composition According to Embodiments of the Inventive Concept is Described.

Figure 5:
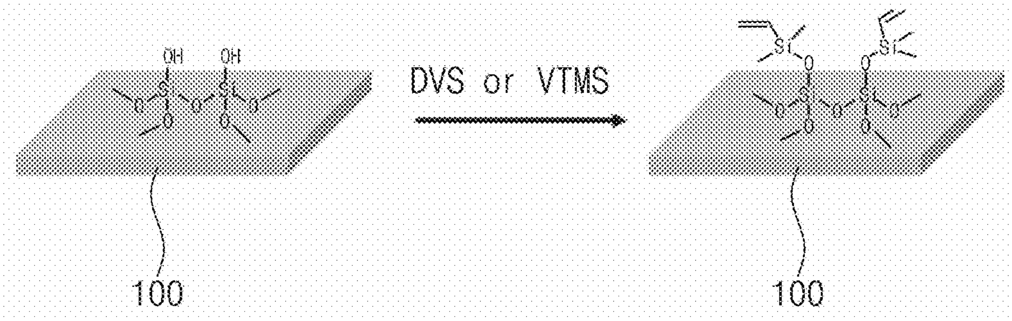
FIG. 5 is a conceptual diagram illustrating a chemical reaction at an interface between a lower layer and an underlayer of FIG. 1.
Figure 6:
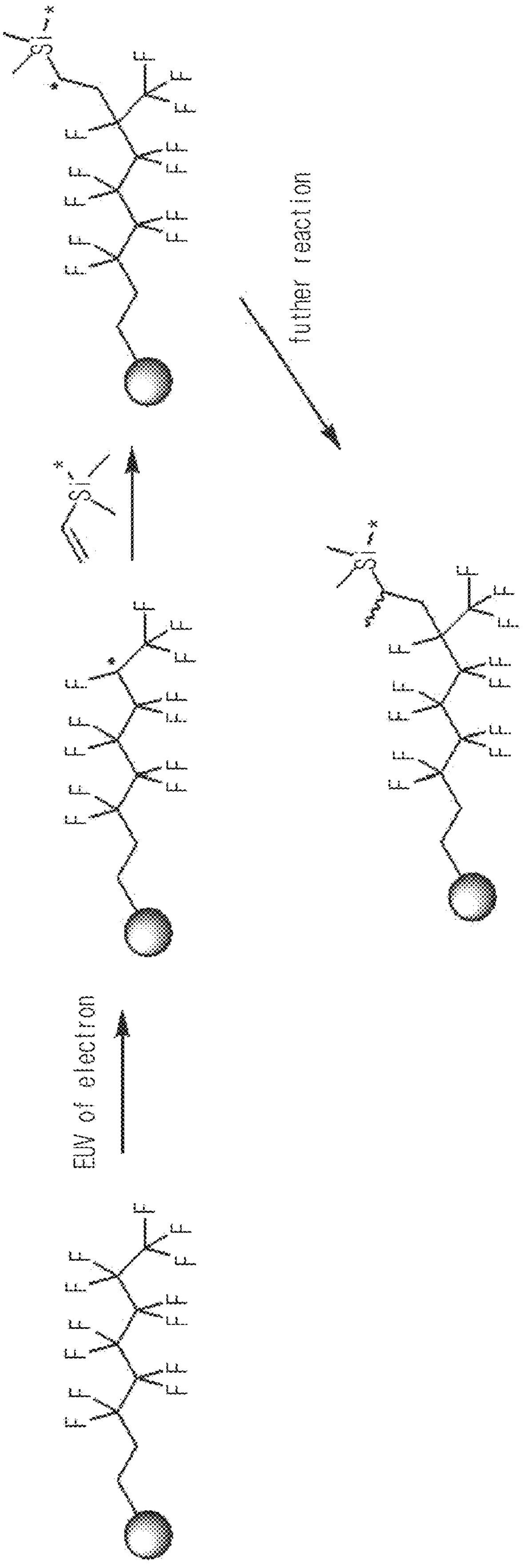
FIG. 6 is a conceptual diagram illustrating a chemical reaction at an interface between a underlayer and a photoresist layer of FIG. 2.

FIGS. 1 to 4 are cross-sectional views illustrating a method of manufacturing a semiconductor device according to embodiments of the inventive concept. FIG. 5 is a conceptual diagram illustrating a chemical reaction at an interface between a lower layer and an underlayer of FIG. 1, and FIG. 6 is a conceptual diagram illustrating a chemical reaction at an interface between a underlayer and a photoresist layer of FIG. 2.

Referring to FIG. 1, an underlayer 110 may be formed on a lower layer 100, and a photoresist layer 120 may be formed on the underlayer 110. The lower layer 100 may be an etch target layer, and may be formed of one selected from a semiconductor material, a conductive material, and an insulating material or a combination thereof. The lower layer 100 may be formed as a single layer or may include a plurality of stacked layers.

According to some embodiments, the underlayer 110 may include the above-described underlayer composition. Forming the underlayer 110 may include applying the underlayer composition on the lower layer 100. For example, the applying of the underlayer composition may be performed by a spin coating method.

Referring to FIGS. 1 and 5, according to some embodiments, a silanol group may be present on a surface of the lower layer 100. The underlayer composition may include the monomolecule having a vinyl group (—CH═CH$_2$), and for example, the monomolecule may include a vinyl group (≡Si—CH═CH$_2$) bonded to a silicon atom. In this case, the silicon atom of the monomolecule may combine with the silanol group of the lower layer 100, and accordingly, the monomolecule having the vinyl group (—CH═CH$_2$) may be fixed to the surface of the lower layer 100. FIG. 5 illustrates a case in which the monomolecule is 1,3-divinyltetramethyldisilazane (DVS) or vinyltrimethoxysilane (VTMS), but the concept of the inventive concept is limited thereto. When the monomolecule is a material including the vinyl group (≡Si—CH═CH$_2$) bonded to the silicon atom, the silicon atom of the monomolecule may combine with the silanol group of the lower layer 100, and thus the monomolecule having the vinyl group (—CH═CH$_2$) may be fixed to the surface of the lower layer 100.

Referring back to FIG. 1, according to some embodiments, the underlayer composition may include the above-described copolymer. In this case, the third repeating unit of the copolymer may be selected to increase adhesion between the underlayer 110 and the lower layer 100.

The photoresist layer 120 may include a resist composition including a fluorinated alkyl group. The resist composition may include a material represented by Chemical Formula 9-1 or Chemical Formula 9-2.

[Chemical Formula 9-1]

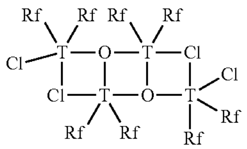

[Chemical Formula 9-2]

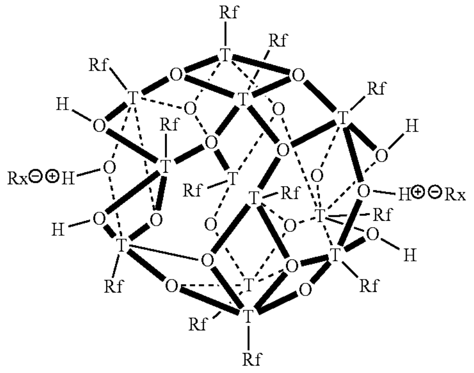

In Chemical Formulas 9-1 and 9-2, "T" may be at least one selected from the group consisting of tin (Sn), zinc (Zn), lithium (Li), sodium (Na), potassium (K), beryllium (Be), magnesium (Mg), calcium (Ca), barium (Ba), aluminum (Al), silicon (Si), cadmium (Cd), mercury (Hg), chromium (Cr), iron (Fe), cobalt (Co), nickel (Ni), copper (Cu), germanium (Ge), palladium (Pd), platinum (Pt), lead (Pb), strontium (Sr), and manganese (Mn), "Rf" which is a fluorinated alkyl group, and may have a structure of —$(CH_2)_p(CF_2)_qCF_3$. Here, "p" is an integer from 0 to 10 or 0 to 3, and "q" is an integer from 0 to 10, 2 to 9, or 0 to 5. In some embodiments, "q" may be greater than or equal to 2 times "p". For example, "Rf" may have a structure of —$(CH_2)_2(CF_2)_5CF_3$.

In Chemical Formula 9-2, "Rx" may have a structure of, for example, $CF_3(CF_2)_2$—O—$CFCF_3CF_2$—O—$CFCF_3COO^-$.

Forming the photoresist layer 120 may include applying the resist composition on the underlayer 110. The applying of the resist composition may include coating (e.g., spin coating) the resist composition on the underlayer 110 using a fluorine-based solvent (e.g., hydrofluoroether (HFE) and/or perfluorocarbon (PFC)). The forming of the photoresist layer 120 may further include performing a heat treatment process (e.g., a soft baking process) on the applied resist composition.

According to embodiments of the inventive concept, the underlayer composition may not include a fluorine atom, and thus may not have solubility in the fluorine-based solvent. Accordingly, during the forming of the photoresist layer 120 using the fluorine-based solvent, damage to the underlayer 110 may be prevented.

Figure 2:
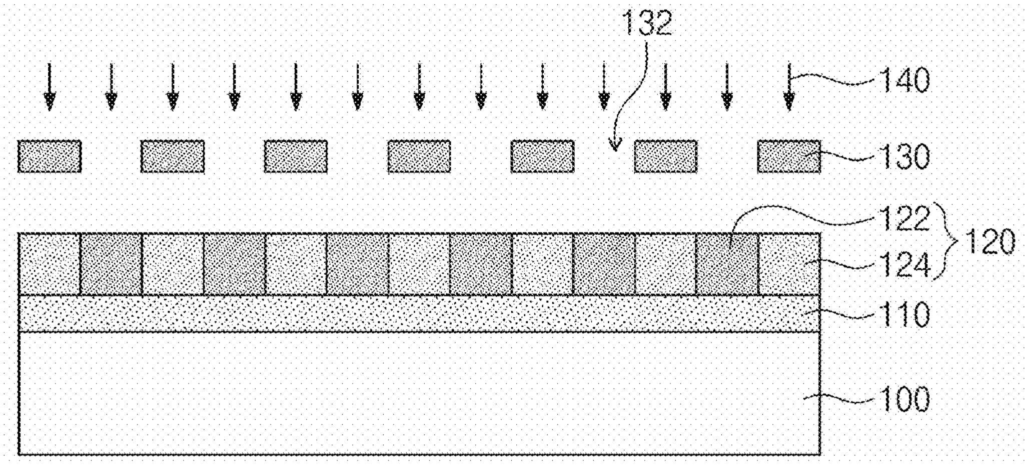

Referring to FIG. 2, an exposure process may be performed on the photoresist layer 120. The exposure process includes aligning a photomask 130 on the photoresist layer 120, and irradiating light 140 onto the photoresist layer 120 through the photomask 130. The light 140 may be electron beam or extreme ultraviolet. The photoresist layer 120 may include a first portion 122 exposed to the light 140 and a second portion 124 not exposed to the light 140. The light 140 may be irradiated to the first portion 122 through an opening 132 of the photomask 130, and may not be irradiated to the second portion 124 blocked by the photomask 130.

Cross-linking of the fluorinated alkyl groups (Rf) of the resist composition may be achieved by irradiation of the light 140, and thus the materials represented by Chemical Formula 9-1 or Chemical Formula 9-2 may combine with each other. As a result, the first portion 122 of the photoresist layer 120 may have a chemical structure in which the fluorinated alkyl groups (Rf) are crosslinked with each other, and a chemical structure of the second portion 124 may not change. Accordingly, after the exposure process, a difference in solubility between the first portion 122 and the second portion 124 may occur.

Referring to FIGS. 2 and 6, some of the fluorinated alkyl groups (Rf) of the resist composition may react with the vinyl group (—CH═CH$_2$) of the underlayer composition or the first functional group by the irradiation of the light 140. For example, the underlayer composition may include the monomolecule having the vinyl group (—CH═CH$_2$), and in this case, some of the fluorinated alkyl groups (Rf) of the resist composition may react with the vinyl group (—CH═CH$_2$) of the monomolecule under the exposure of the electron beam or the extreme ultraviolet. As another example, the underlayer composition may include the above-described copolymer, and in this case, some of the fluorinated alkyl groups (Rf) of the resist composition may react with the first functional group of the first repeating unit under the exposure of the electron beam or the extreme ultraviolet.

FIG. 6 illustrates the fluorinated alkyl group (Rf) has a structure of —$(CH_2)_2(CF_2)_5CF_3$, and the first functional group of the underlayer composition has a structure of Chemical Formula 2-1, the concept of the inventive concept is not limited thereto. The fluorinated chain or C—F bond in the fluorinated alkyl group (Rf) of the resist composition may be broken by the irradiation of the light 140, and thus, a carbon-based radical (*) may be generated. A double bond of the vinyl group (—CH═$CH_2$) of the underlayer composition or a double bond between carbon atoms of the first functional group may be broken and react with the carbon-based radical (*), and thus, a covalent bond between carbon atoms may be formed. Accordingly, the first portion 122 of the photoresist layer 120 may be fixed on the underlayer 110 through chemically combining with the underlayer 110. In this case, an additional heat treatment process (e.g., a bake process) for fixing the exposed photoresist layer 120 on the underlayer 110 may be omitted.

Figure 3:
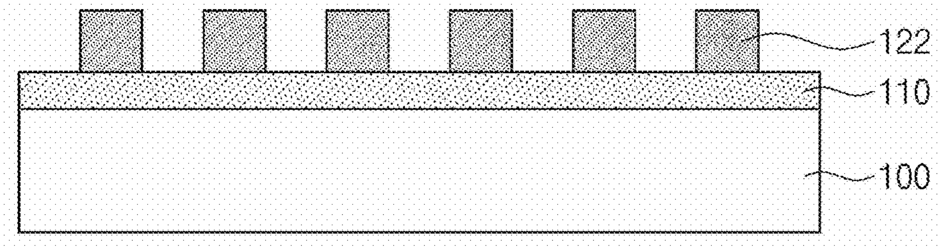

Referring to FIG. 3, after the exposure process, the photomask 130 may be removed. A developing process may be performed on the exposed photoresist layer 120. Performing the developing process may include removing the second portion 124 of the photoresist layer 120 using a developer. The first portion 122 of the photoresist layer 120 may be referred to as a photoresist pattern. The developer may include a fluorine-based solvent and a solution containing the same. The fluorine-based solvent may include, for example, at least one of hydrofluoroether (HFE) and perfluorocarbon (PFC). By the developing process, the second portion 124 of the photoresist layer 120 may be selectively removed, and the photoresist pattern 122 may have a negative tone pattern.

According to embodiments of the inventive concept, the underlayer composition may not include a fluorine atom, and thus may not have solubility in the fluorine-based solvent. Accordingly, damage to the underlayer 110 may be prevented during the developing process using the fluorine-based solvent. In addition, the underlayer composition may include the vinyl group (—CH═$CH_2$) or the first functional group capable of chemically combining with the fluorinated alkyl group (Rf) of the resist composition. Accordingly, the photoresist pattern 122 may be fixed on the underlayer 110 through chemically combining with the underlayer 110.

According to the inventive concept, the photoresist layer 120 may include the resist composition including the fluorinated alkyl group (Rf), and the underlayer composition may include the vinyl group (—CH═$CH_2$) or the first functional group capable of chemically combining with the fluorinated alkyl group (Rf) of the resist composition. By cross-linking of the fluorinated alkyl groups (Rf) of the resist composition during the exposure process, a difference in solubility between the first portion 122 and the second portion 124 of the photoresist layer 120 may occur and the developing process may be performed using the solubility difference. Accordingly, resolution and sensitivity of the photoresist pattern 122 may be improved. In addition, the photoresist pattern 122 may be fixed on the underlayer 110 through chemically combining with the underlayer 110. Accordingly, collapse of the photoresist pattern 122 may be suppressed.

Figure 4:
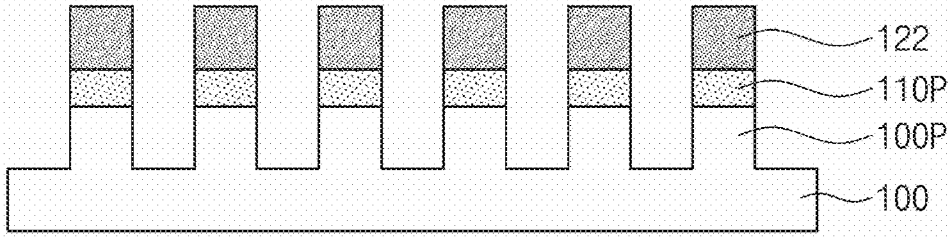

Referring to FIG. 4, the underlayer 110 and the lower layer 100 may be etched using the photoresist pattern 122 as an etch mask. Etching the underlayer 110 and the lower layer 100 may include, for example, performing a wet or dry etching process. The underlayer 110 may be etched to form an underlayer pattern 110P, and an upper portion of the lower layer 100 may be etched to form a lower pattern 100P. After the lower pattern 100P is formed, the photoresist pattern 122 and the underlayer pattern 110P may be removed. The lower pattern 100P may be a semiconductor pattern, a conductive pattern, or an insulating pattern in a semiconductor device.

A Multi-Layer Structure Formed Using a Underlayer Composition According to Embodiments of the Inventive Concept is Described.

According to some embodiments, a multilayer structure may include the lower layer 100, the underlayer 110, and the photoresist layer 120 described with reference to FIG. 1. The underlayer 110 may include the above-described underlayer composition. For example, the underlayer composition may include the monomolecule having the vinyl group (—CH═$CH_2$). As another example, the underlayer composition may include the above-described copolymer. The photoresist layer 120 may include the resist composition including the fluorinated alkyl group.

According to some embodiments, the multilayer structure may include the lower layer 100, the underlayer 110, and the photoresist layer 120 described with reference to FIG. 2. The photoresist layer 120 may include the first portion 122 exposed to the light 140 and the second portion 124 not exposed to the light 140. The first portion 122 of the photoresist layer 120 may have the chemical structure in which the fluorinated alkyl groups are crosslinked with each other, and the chemical structure of the second portion 124 of the photoresist layer 120 may not be changed. Some of the fluorinated alkyl groups (Rf) in the first portion 122 of the photoresist layer 120 may react with the vinyl group (—CH═$CH_2$) or the first group of the underlayer composition, under the exposure to the electron beam or the extreme ultraviolet, and accordingly, the covalent bond between the carbon atoms may be formed at a boundary between the first portion 122 of the photoresist layer 120 and the underlayer 110. Accordingly, the first portion 122 of the photoresist layer 120 may be fixed on the underlayer 110 through chemically combining with the underlayer 110.

According to some embodiments, the multilayer structure may include the lower layer 100, the underlayer 110, and the photoresist pattern 122 described with reference to FIG. 3. The photoresist pattern 122 may correspond to the first portion 122 of the photoresist layer 120.

Figure 7:
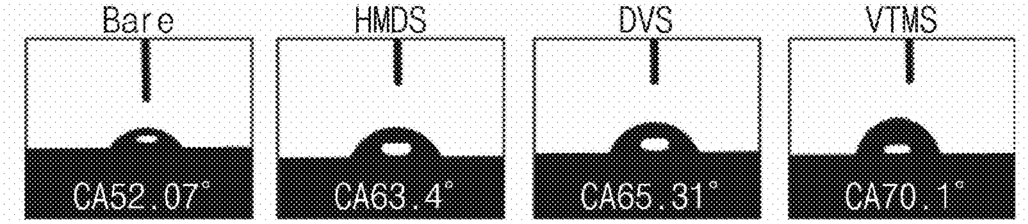
FIG. 7 is a view illustrating contact angles between water and substrates coated with underlayer compositions according to some embodiments of the inventive concept.

FIG. 7 is a View Illustrating Contact Angles Between Water and Substrates Coated With Underlayer Compositions According to Some Embodiments of the Inventive Concept.

Referring to FIG. 7, it may be seen that results of measuring contact angles with water for a substrate (bare), a substrate coated with hexamethyldisilazane (HMDS), a substrate coated with 1,3-divinyltetramethyldisilazane (DVS), and a substrate coated with vinyltrimethoxysilane (VTMS) are about 52°, about 63.4°, about 65°, and about 70.1°, respectively. For example; the substrate may be a silicon substrate, and may correspond to the lower layer 100 described with reference to FIGS. 1 to 4. From the results of FIG. 7, when the underlayer composition includes the monomolecule having the vinyl group (—CH═$CH_2$), it may be seen that the monomolecule having the vinyl group (—CH═$CH_2$) chemically reacts with the surface of the lower layer 100 and is fixed to the surface of the lower layer 100.

Figure 8:
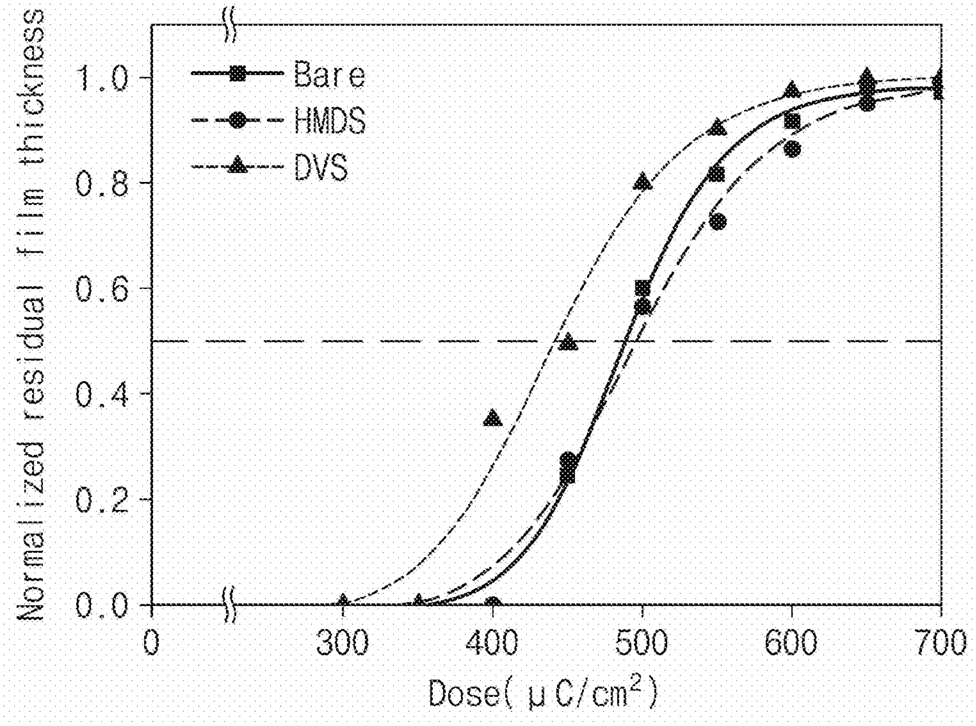
FIGS. 8 to 10 are graphs illustrating changes in solubility of photoresist layers on substrates coated with underlayer compositions according to some embodiments of the inventive concept.
Figure 9:
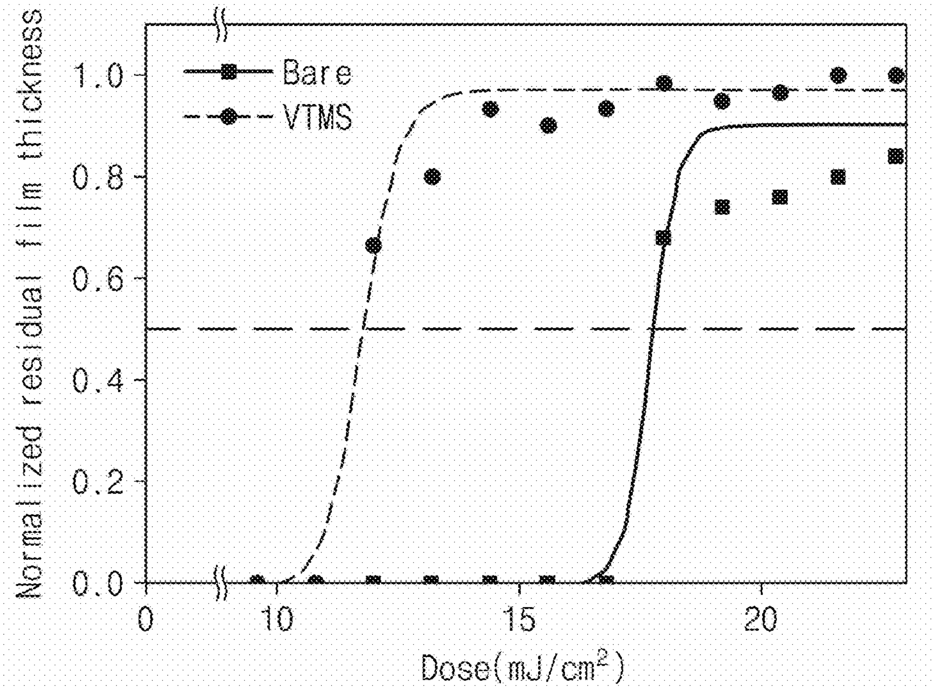
Figure 10:
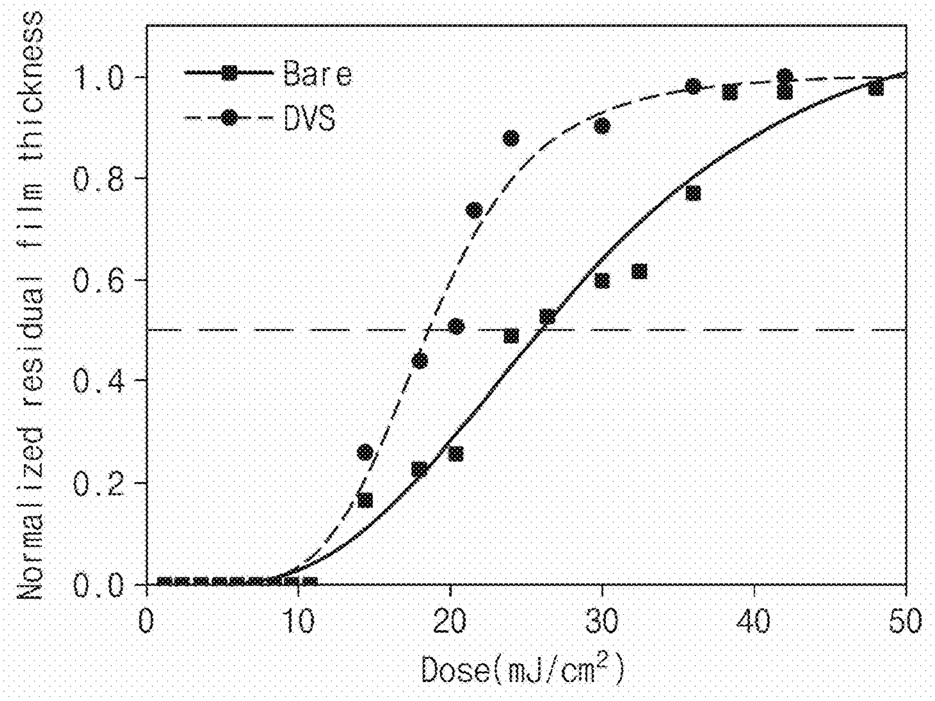

FIGS. 8 to 10 are Graphs Illustrating Changes in Solubility of Photoresist Layers on Substrates Coated with Underlayer Compositions According to Some Embodiments of the Inventive Concept.

Experimental Example 1

Photoresist layer were formed on a substrate (bare), a substrate coated with hexamethyldisilazane (HMDS), and a substrate coated with 1,3-divinyltetramethyldisilazane (DVS), respectively, and changes in solubility of the photoresist layers by irradiation with electron beam (E-beam) were evaluated. The photoresist layers include the resist composition including the fluorinated alkyl group.

1) Evaluation of Solubility Change of Photoresist Layer on Substrate (Bare)

4% wt/vol of a resist solution dissolved in PF-7600 (3M) was spin-coated on an untreated silicon substrate at 1,250 rpm for 60 seconds, and then heated at 80° C. for 1 minute to form a photoresist thin layer (a thickness of approximately 100 nm). Thereafter, electron beam of 50 μC/cm$^2$ to 1,500 μC/cm$^2$ was irradiated under an acceleration voltage of 80 keV, and then a developing process was performed for 5 seconds using PF-7600. As a result, a negative photoresist pattern having a line-width of 300 nm was formed. Afterwards, a thickness of the photoresist pattern was measured through Alpha-step®D-300 stylus profiler manufactured by Kla-Tencor. A solubility of the photoresist layer was evaluated using a difference between the thickness of the photoresist thin layer and the thickness of the photoresist pattern.

2) Evaluation of Solubility Change of Photoresist Layer on Substrate Coated with HMDS 20 wt % of a solution prepared by dissolving HMDS in propylene glycol monomethyl ether acetate (PGMEA) was spin-coated on a silicon substrate at 3000 rpm for 30 seconds, and then heated at 110° C. for 1 minute to coat HMDS on the silicon substrate. Thereafter, 4% wt/vol of a resist solution dissolved in PF-7600 (3M) was spin-coated on the silicon substrate coated with HMDS at 1,250 rpm for 60 seconds, and then heated at 80° C. for 1 minute to form a photoresist thin layer (a thickness of approximately 100 nm). Afterwards, electron beam of 50 μC/cm$^2$ to 1,500 μC/cm$^2$ was irradiated under an acceleration voltage of 80 keV, and then a developing process was performed for 5 seconds using PF-7600. As a result, a negative photoresist pattern having a line-width of 300 nm was formed. Afterwards, a thickness of the photoresist pattern was measured through Alpha-step®D-300 stylus profiler manufactured by Kla-Tencor. A solubility of the photoresist layer was evaluated using a difference between the thickness of the photoresist thin layer and the thickness of the photoresist pattern.

3) Evaluation of Solubility Change of Photoresist Layer on Substrate Coated with DVS 20 wt % of a solution prepared by dissolving DVS in propylene glycol monomethyl ether acetate (PGMEA) was spin-coated on a silicon substrate at 3000 rpm for 30 seconds, and then heated at 110° C. for 1 minute to coat DVS on the silicon substrate. Thereafter, 4% wt/vol of a resist solution dissolved in PF-7600 (3M) was spin-coated on the silicon substrate coated with DVS at 1,250 rpm for 60 seconds, and then heated at 80° C. for 1 minute to form a photoresist thin layer (a thickness of approximately 100 nm). Afterwards, electron beam of 50 μC/cm$^2$ to 1,500 μC/cm$^2$ was irradiated under an acceleration voltage of 80 keV, and then a developing process was performed for 5 seconds using PF-7600. As a result, a negative photoresist pattern having a line-width of 300 nm was formed. Afterwards, a thickness of the photoresist pattern was measured through Alpha-step®D-300 stylus profiler manufactured by Kla-Tencor. A solubility of the photoresist layer was evaluated using a difference between the thickness of the photoresist thin layer and the thickness of the photoresist pattern.

FIG. 8 illustrates results of Experimental Example 1. Referring to FIG. 8, in a case of the untreated silicon substrate (bare), when the electron beam of 488 μC/cm$^2$ was irradiated onto the photoresist thin layer, the thickness of the photoresist pattern was capable of being maintained at about 50% of the thickness of the photoresist thin layer. In a case of the substrate coated with HMDS, when the electron beam of 496 μC/cm$^2$ was irradiated onto the photoresist thin layer, the thickness of the photoresist pattern was capable of being maintained at about 50% of the thickness of the photoresist thin layer. In a case of a substrate coated with DVS, when the electron beam of 441 μC/cm$^2$ was irradiated onto the photoresist thin layer, the thickness of the photoresist pattern was capable of being maintained at about 50% of the thickness of the photoresist thin layer. That is, in the case of the substrate coated with DVS, the negative photoresist pattern was capable of being formed using a relatively smaller amount of electron beam irradiation.

Experimental Example 2

Photoresist layers were formed on a substrate (bare) and a substrate coated with vinyltrimethoxysilane (VTMS), respectively, and changes in solubility of the photoresist layers with extreme ultraviolet (EUV) irradiation were evaluated. The photoresist layers include the resist composition including the fluorinated alkyl group.

1) Evaluation of Solubility Change of Photoresist Layer on Substrate (Bare)

1.3% wt/vol of a resist solution dissolved in PF-7600 (3M) was spin-coated on an untreated silicon substrate at 1,500 rpm for 60 seconds, and then heated at 80° C. for 1 minute to obtain a photoresist thin layer (a thickness of approximately 25 nm). Thereafter, extreme UV (an exposure amount of 1 mJ/cm$^2$ to 40 mJ/cm$^2$) was irradiated using a MET5 EUV exposure machine owned by Lawrence Berkeley National Laboratory (USA), and then a developing process was performed for 5 seconds using PF-7600. As a result, a negative photoresist pattern was formed. Afterwards, a thickness of the photoresist pattern was measured through Alpha-step®D-300 stylus profiler manufactured by Kla-Tencor. A solubility of the photoresist layer was evaluated using a difference between the thickness of the photoresist thin layer and the thickness of the photoresist pattern.

2) Evaluation of Solubility Change of Photoresist Layer on Substrate Coated with VTMS 20 wt % of a solution prepared by dissolving VTMS in propylene glycol monomethyl ether acetate (PGMEA) was spin-coated on a silicon substrate at 3000 rpm for 30 seconds, and then heated at 110° C. for 1 minute to coat the VTMS on the silicon substrate. Thereafter, 1.3% wt/vol of a resist solution dissolved in PF-7600 (3M) was spin-coated on the silicon substrate coated with VTMS at 1,500 rpm for 60 seconds, and then heated at 80° C. for 1 minute to form a photoresist thin layer (a thickness of approximately 25 nm). Afterwards, extreme UV (an exposure amount of 1 mJ/cm$^2$ to 40 mJ/cm$^2$) was irradiated using a MET5 EUV exposure machine owned by Lawrence Berkeley National Laboratory (USA), and then a developing process was performed for 5 seconds using PF-7600. As a result, a negative photoresist pattern was formed. Then, a thickness of the photoresist pattern was measured through Alpha-step®D-300 stylus profiler manufactured by Kla-Tencor. A solubility of the photoresist layer was evaluated using a difference between the thickness of the photoresist thin layer and the thickness of the photoresist pattern.

FIG. 9 illustrates results of Experimental Example 2. Referring to FIG. 9, in a case of the untreated silicon substrate (bare), when the extreme ultraviolet of 18 mJ/cm$^2$ was irradiated on the photoresist thin layer, the thickness of the photoresist pattern was capable of being maintained at about 50% of the thickness of the photoresist thin layer. In a case of the substrate coated with VTMS, when the extreme ultraviolet of 12 $mJ/cm^2$ was irradiated on the photoresist thin layer, the thickness of the photoresist pattern was capable of being maintained at about 50% of the thickness of the photoresist thin layer. That is, in the case of the substrate coated with VTMS, the negative photoresist pattern was capable of being formed using a relatively smaller amount of extreme ultraviolet radiation.

Experimental Example 3

Photoresist layers were formed on a substrate (bare) and a substrate coated with 1,3-divinyltetramethyldisilazane (DVS), respectively, and changes in solubility of the photoresist layers with extreme ultraviolet (EUV) irradiation were evaluated. The photoresist layers include the resist composition including the fluorinated alkyl group.

1) Evaluation of Solubility Change of Photoresist Layer on Substrate (Bare)

2.5% wt/vol of a resist solution dissolved in HFE-7500 (3M) was spin-coated on an untreated silicon substrate at 1,500 rpm for 60 seconds, and then heated at 80° C. for 1 minute to obtain a photoresist thin layer (a thickness of approximately 25 nm). Thereafter, extreme UV (an exposure dose of 1 $mJ/cm^2$ to 40 $mJ/cm^2$) was irradiated using a MET5 EUV exposure machine owned by Lawrence Berkeley National Laboratory (USA), and then a developing process was performed for 5 seconds using 2-propanol. As a result, a negative photoresist pattern was formed. Afterwards, a thickness of the photoresist pattern was measured through Alpha-step®D-300 stylus profiler manufactured by Kla-Tencor. A solubility of the photoresist layer was evaluated using a difference between the thickness of the photoresist thin layer and the thickness of the photoresist pattern.

2) Evaluation of Solubility Change of Photoresist Layer on Substrate Coated with DVS 20 wt % of a solution prepared by dissolving DVS in propylene glycol monomethyl ether acetate (PGMEA) was spin-coated on a silicon substrate at 3000 rpm for 30 seconds, and then heated at 110° C. for 1 minute to coat DVS on the silicon substrate. Thereafter, 2.5% wt/vol of a resist solution dissolved in HFE-7500 (3M) was spin-coated on the silicon substrate coated with DVS at 1,500 rpm for 60 seconds, and then heated at 80° C. for 1 minute to form a photoresist thin layer (a thickness of approximately 25 nm). Afterwards, extreme UV (an exposure dose of 1 $mJ/cm^2$ to 40 $mJ/cm^2$) was irradiated using a MET5 EUV exposure machine owned by Lawrence Berkeley National Laboratory (USA), and then a developing process was performed for 5 seconds using 2-propanol. As a result, a negative photoresist pattern was formed. Then, a thickness of the photoresist pattern was measured through Alpha-step®D-300 stylus profiler manufactured by Kla-Tencor. A solubility of the photoresist layer was evaluated using a difference between the thickness of the photoresist thin layer and the thickness of the photoresist pattern.

FIG. 10 illustrates results of Experimental Example 3. Referring to FIG. 10, in a case of the untreated silicon substrate (bare), when the extreme ultraviolet of 26 $mJ/cm^2$ was irradiated on the photoresist thin layer, the thickness of the photoresist pattern was capable of being maintained at about 50% of the thickness of the photoresist thin layer. In a case of the substrate coated with DVS, when the extreme ultraviolet of 19 $mJ/cm^2$ was irradiated on the photoresist thin layer, the thickness of the photoresist pattern was capable of being maintained at about 50% of the thickness of the photoresist thin layer. That is, in the case of the substrate coated with DVS, the negative photoresist pattern was capable of being formed using a relatively smaller amount of extreme ultraviolet radiation.

Figure 11:
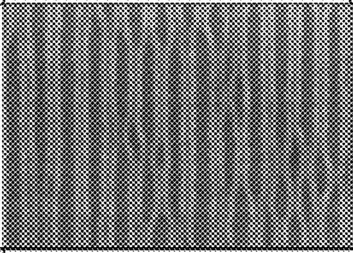
FIGS. 11 and 12 are images of photoresist patterns formed on substrates coated with underlayer compositions according to some embodiments of the inventive concept.
Figure 11:
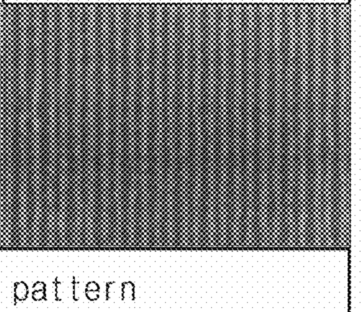
Figure 12:
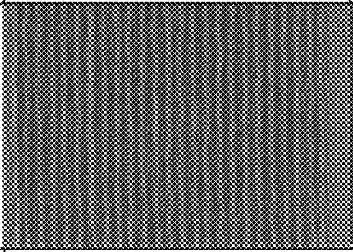
Figure 12:
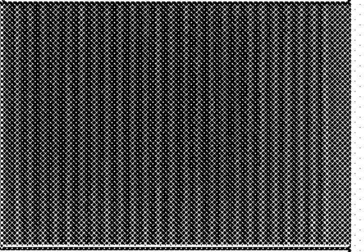

FIGS. 11 and 12 are Images of Photoresist Patterns Formed on Substrates Coated With Underlayer Compositions According to Some Embodiments of the Inventive Concept.

Experimental Example 4

Negative photoresist patterns were formed by performing an extreme ultraviolet lithography process on a substrate (X) on which a underlayer was not formed, and a substrate coated with vinyltrimethoxysilane (VTMS), respectively.

1) Forming Photoresist Pattern on Substrate (X) on which Underlayer is not Formed 1.3% wt/vol of a resist solution dissolved in PF-7600 (3M) was spin-coated on an untreated silicon substrate at 1,500 rpm for 60 seconds, and then heated at 80° C. for 1 minute to obtain a photoresist thin layer (a thickness of approximately 25 nm). Thereafter, extreme ultraviolet (an exposure amount of 106.8 $mJ/cm^2$) was irradiated using a MET5 EUV exposure machine owned by Lawrence Berkeley National Laboratory (USA), and then a developing process was performed for 5 seconds using PF-7600. As a result, a negative photoresist pattern was formed.

2) Forming Photoresist Pattern on Substrate Coated with VTMS 20 wt % of a solution prepared by dissolving VTMS in propylene glycol monomethyl ether acetate (PGMEA) was spin-coated on a silicon substrate at 3000 rpm for 30 seconds, and then heated at 110° C. for 1 minute to coat the VTMS on the silicon substrate. Thereafter, 1.3% wt/vol of a resist solution dissolved in PF-7600 (3M) was spin-coated on the silicon substrate coated with VTMS at 1,500 rpm for 60 seconds, and then heated at 80° C. for 1 minute to form a photoresist thin layer (a thickness of approximately 25 nm). Afterwards, extreme ultraviolet (an exposure amount of 106.8 $mJ/cm^2$) irradiated using a MET5 EUV exposure machine owned by Lawrence Berkeley National Laboratory (USA), and then a developing process was performed for 5 seconds using PF-7600. As a result, a negative photoresist pattern was formed.

FIG. 11 illustrates results of Experimental Example 4. As the results of the photolithography process under extreme ultraviolet irradiation (exposure dose: 106.8 $mJ/cm^2$), bridge defects occurred in the photoresist pattern on the substrate (X) on which the underlayer was not formed, but the photoresist pattern on the substrate coated with VTMS was formed to have a straight shape.

Experimental Example 5

An extreme ultraviolet lithography process was performed on the substrate (X) on which the underlayer was not formed and the substrate coated with 3 divinyltetramethyldisilazane (DVS) to form negative photoresist patterns, respectively.

1) Forming Photoresist Pattern on Substrate (X) on which Underlayer is not Formed 2.5% wt/vol of a resist solution dissolved in HFE-7500 (3M) was spin-coated on an untreated silicon substrate at 1,500 rpm for 60 seconds, and then heated at 80° C. for 1 minute to obtain a photoresist thin layer (a thickness of approximately 25 nm). Thereafter, extreme UV (exposure dose of 114 $mJ/cm^2$) was irradiated using a MET5 EUV exposure machine owned by Lawrence Berkeley National Laboratory (USA), and then a developing process was performed for 5 seconds using 2-propanol. As a result, a negative photoresist pattern was formed.

2) Forming Photoresist Pattern on Substrate Coated with DVS 20 wt % of a solution prepared by dissolving DVS in propylene glycol monomethyl ether acetate (PGMEA) was spin-coated on a silicon substrate at 3000 rpm for 30 seconds, and then heated at 110° C. for 1 minute to coat DVS on the silicon substrate. Thereafter, 2.5% wt/vol of a resist solution dissolved in HFE-7500 (3M) was spin-coated on the silicon substrate coated with DVS at 1,500 rpm for 60 seconds, and then heated at 80° C. for 1 minute to form a photoresist thin layer (a thickness of approximately 25 nm). Afterwards, extreme UV (an exposure amount of 114 $mJ/cm^2$) was irradiated using a MET5 EUV exposure machine owned by Lawrence Berkeley National Laboratory (USA), and then a developing process was performed for 5 seconds using 2-propanol. As a result, a negative photoresist pattern was formed.

FIG. 12 illustrates results of Experimental Example 5. As the results of performing the photolithography process under extreme ultraviolet irradiation (exposure dose 114 $mJ/cm^2$), line edge roughness (LER) of the photoresist pattern on the substrate coated with DVS was reduced compared to line edge roughness of the substrate (X) on which the underlayer was not formed.

Figure 13:
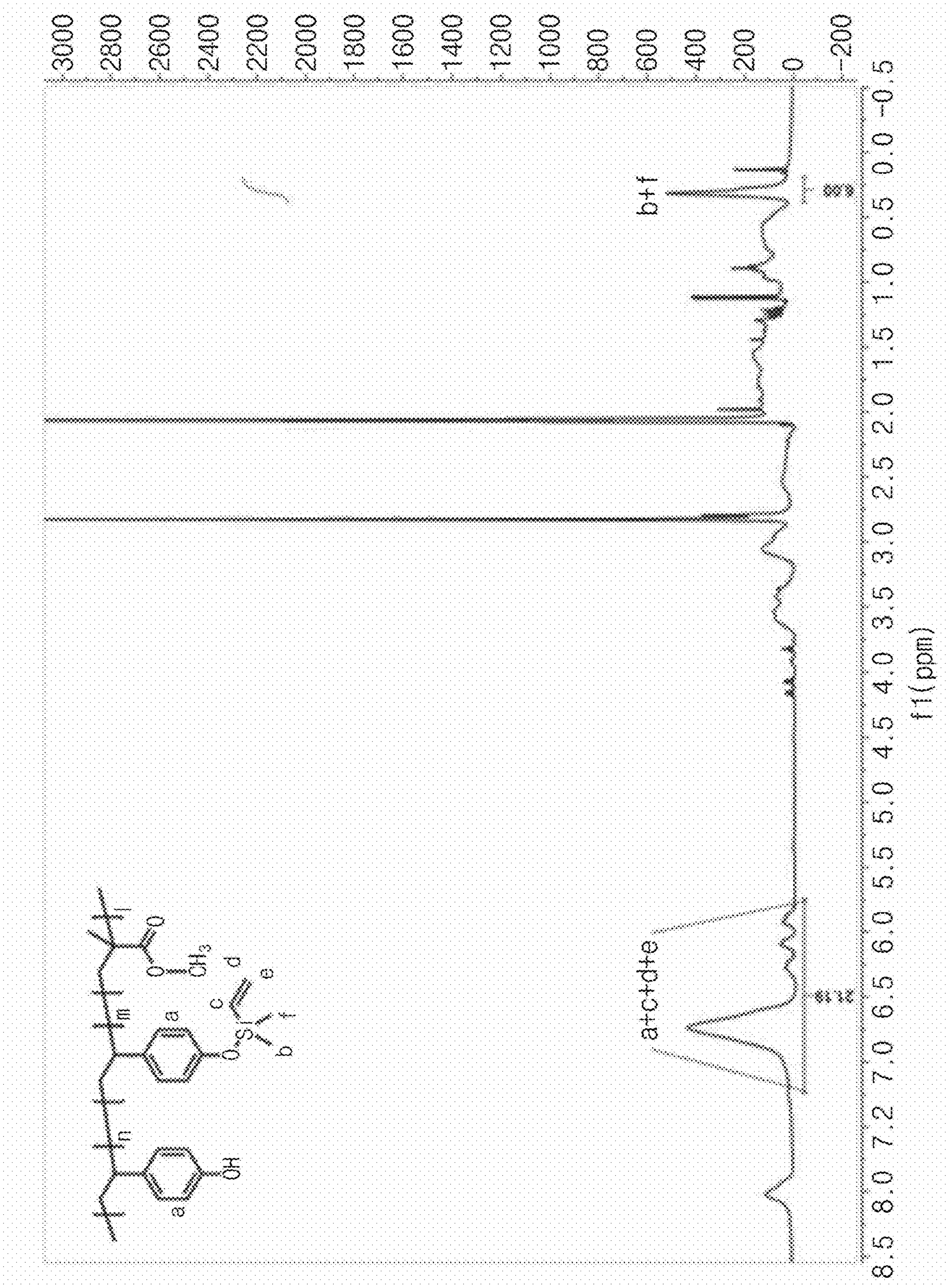
FIGS. 13 to 15 are graphs illustrating nuclear magnetic resonance spectrum results of underlayer compositions according to some embodiments of the inventive concept.
Figure 14:
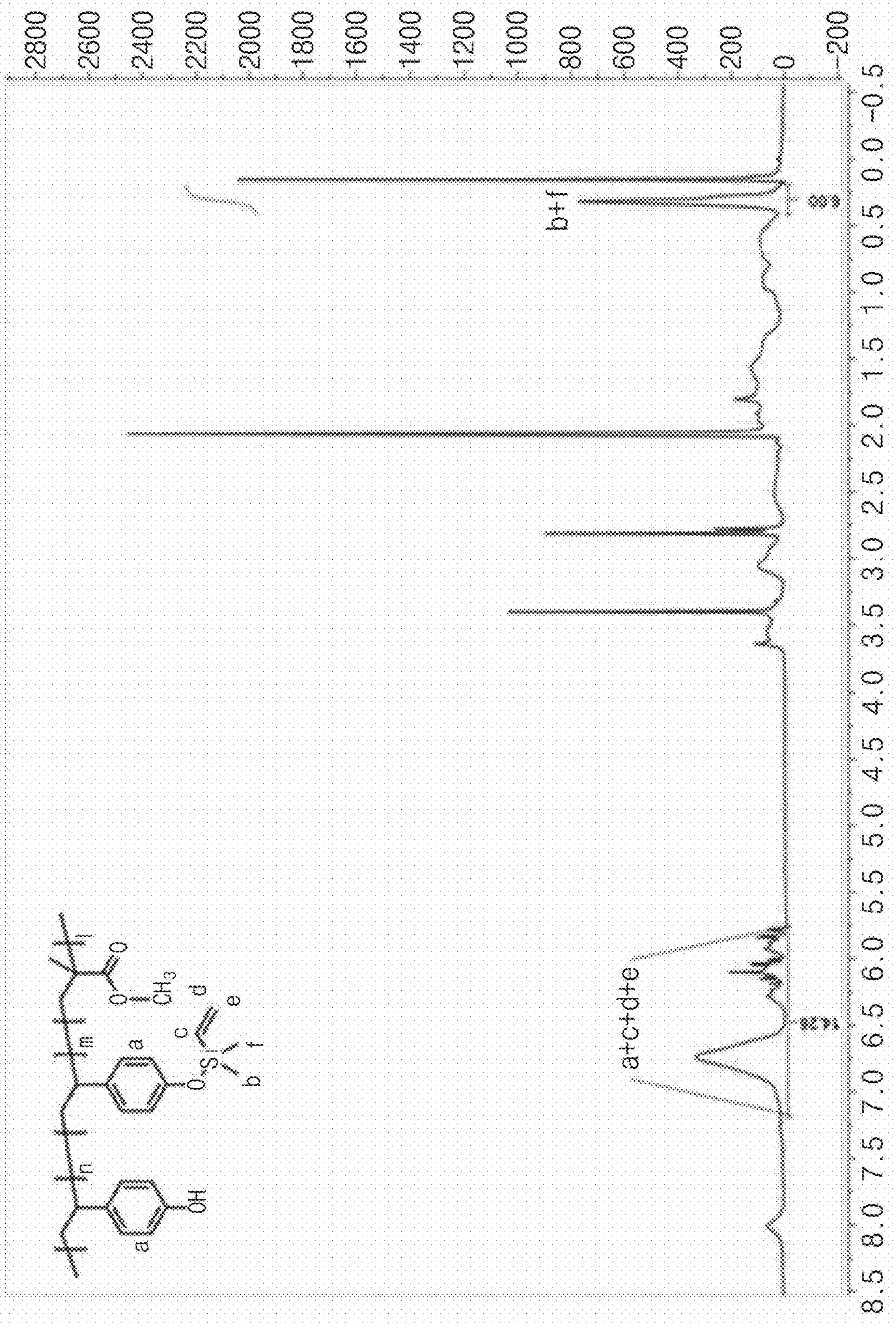
Figure 15:
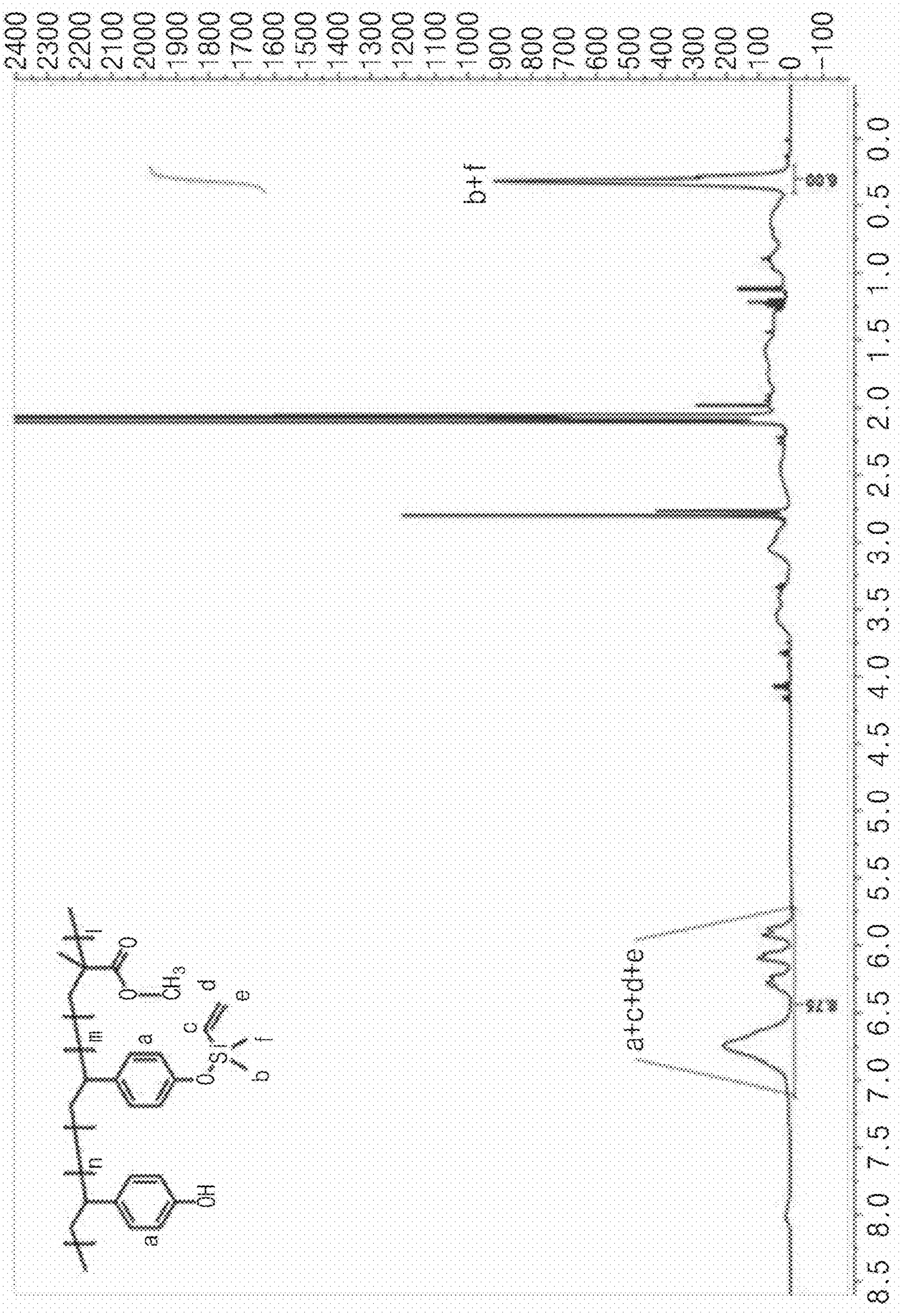

FIGS. 13 to 15 are Graphs Illustrating Nuclear Magnetic Resonance Spectrum Results of Underlayer Compositions According to Some Embodiments of the Inventive Concept.

In some embodiments, the underlayer composition may include a copolymer having the first functional group. In FIGS. 13 to 15, a x-axis represents f1 (ppm), and a y-axis represents intensity (unit: arbitrary value, a.u.). FIG. 13 illustrates a nuclear magnetic resonance spectrum result of the copolymer synthesized according to Synthesis Example 1, FIG. 14 illustrates a nuclear magnetic resonance spectrum result of the copolymer synthesized according to Synthesis Example 2, and FIG. 15 is a nuclear magnetic resonance spectrum result of the copolymer synthesized according to Synthesis Example 3. Referring to FIGS. 13 to 15, it may be seen that the copolymers produced according to Synthesis Examples 1 to 3 are a material represented by Chemical Formula 8-1.

Figure 16:
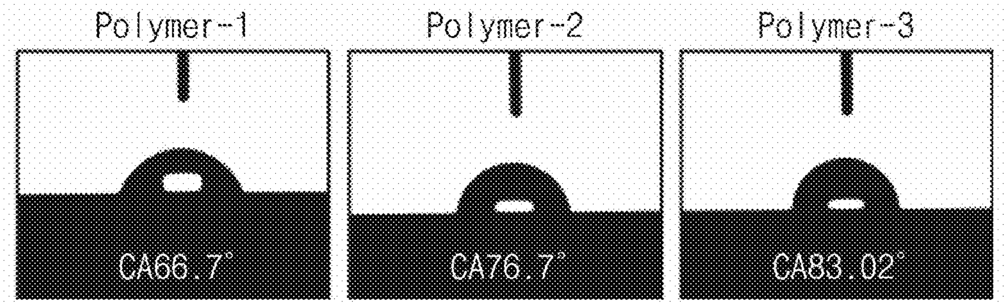
FIG. 16 is a view illustrating contact angles between water and substrates coated with underlayer compositions according to some embodiments of the inventive concept.

FIG. 16 is a View Illustrating Contact Angles Between Water and Substrates Coated With Underlayer Compositions According to Some Embodiments of the Inventive Concept.

Referring to FIG. 16, it may be seen that results of measuring contact angles with water for a substrate coated with the copolymer (polymer-1) produced according to Synthesis Example 1, a substrate coated with the copolymer (polymer-2) produced according to Synthesis Example 2, and a substrate coated with the copolymer (polymer-3) produced according to Synthesis Example 3 are about 66.7°, about 76.7°, and about 83°, respectively. For example, the substrate may be a silicon substrate, and may correspond to the lower layer 100 described with reference to FIGS. 1 to 4. From the results of Synthesis Examples 1 to 3 and FIG. 16, it may be seen that hydrophobicity of the surface of the substrate (i.e., the lower layer 100) is increased as a ratio of the first repeating unit having the first functional group in the copolymer increases.

Figure 17:
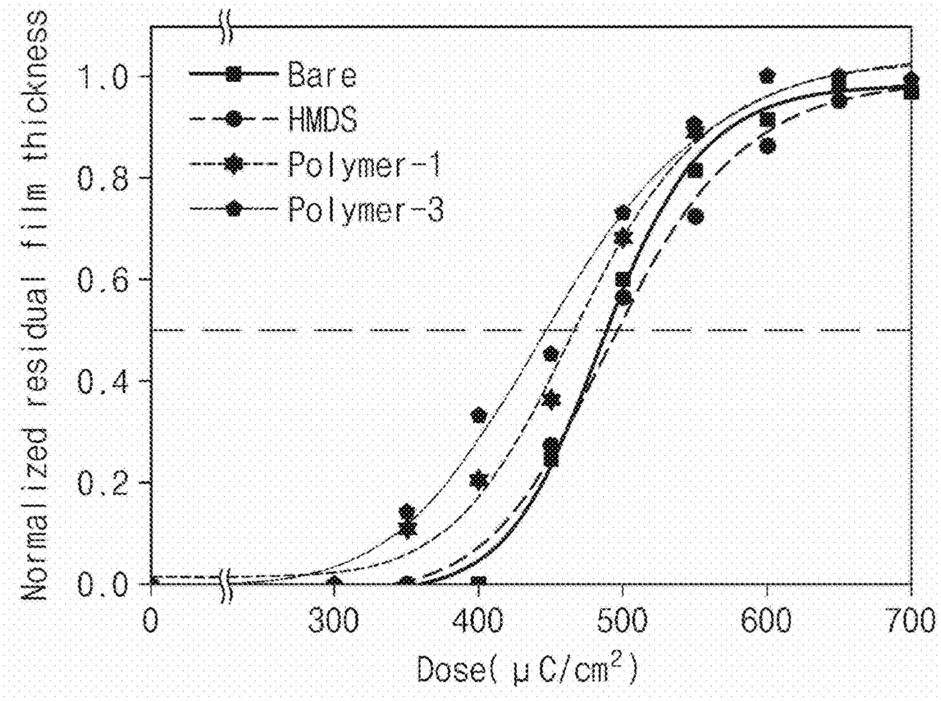
FIG. 17 is a graph illustrating changes in solubility of photoresist layers on substrates coated with underlayer compositions according to some embodiments of the inventive concept.

FIG. 17 is a Graph Illustrating Changes in Solubility of Photoresist Layers on Substrates Coated with Underlayer Compositions According to Some Embodiments of the Inventive Concept.

Experimental Example 6

Photoresist layers were formed on a substrate (bare), a substrate coated with hexamethyldisilazane (HMDS), a substrate coated with the copolymer (polymer-1) produced according to Synthesis Example 1, and a substrate with the copolymer (polymer-3) produced according to Synthesis Example 3, respectively, and solubility changes of the photoresist layers with electron beam (E-beam) irradiation were evaluated. The photoresist layers include the resist composition including the fluorinated alkyl group.

1) Evaluation of Solubility Change of Photoresist Layer on Substrate (Bare)

4% wt/vol of a resist solution dissolved in PF-7600 (3M) was spin-coated on an untreated silicon substrate at 1,250 rpm for 60 seconds, and then heated at 80° C. for 1 minute to obtain a photoresist thin layer (a thickness of approximately 100 nm). Thereafter, electron beam of 50 $\mu C/cm^2$ to 1,500 $\mu C/cm^2$ was irradiated under an acceleration voltage of 80 keV, and a developing process was performed for 5 seconds using PF-7600. As a result, a negative photoresist pattern having a line-width of 300 nm was formed. Afterwards, a thickness of the photoresist pattern was measured through Alpha-step®D-300 stylus profiler manufactured by Kla-Tencor. A solubility of the photoresist layer was evaluated using a difference between the thickness of the photoresist thin layer and the thickness of the photoresist pattern.

2) Evaluation of Solubility Change of Photoresist Layer on Substrate Coated with HMDS 20 wt % of a solution prepared by dissolving HMDS in propylene glycol monomethyl ether acetate (PGMEA) was spin-coated on a silicon substrate at 3000 rpm for 30 seconds, and then heated at 110° C. for 1 minute to coat HMDS on the silicon substrate. Thereafter, 4% wt/vol of a resist solution dissolved in PF-7600 (3M) was spin-coated on the silicon substrate coated with HMDS at 1,250 rpm for 60 seconds, and then heated at 80° C. for 1 minute to form a photoresist thin layer (a thickness of approximately 100 nm). Then, electron beam of 50 $\mu C/cm^2$ to 1,500 $\mu C/cm^2$ was irradiated under an acceleration voltage of 80 keV, and a developing process was performed for 5 seconds using PF-7600. As a result, a negative photoresist pattern having a line-width of 300 nm was formed. Afterwards, a thickness of the photoresist pattern was measured through Alpha-step®D-300 stylus profiler manufactured by Kla-Tencor. A solubility of the photoresist layer was evaluated using a difference between the thickness of the photoresist thin layer and the thickness of the photoresist pattern.

3) Evaluation of Solubility Change of Photoresist Layer on Substrate Coated with Polymer-1

2.5% wt/vol of a solution prepared by dissolving the copolymer (polymer-1) prepared according to Synthesis Example 1 in propylene glycol monomethyl ether acetate (PGMEA) was spin-coated on a silicon substrate at 2,000 rpm for 60 seconds, and then heated at 110° C. for 1 minute to coat the polymer-1 (a thickness of approximately 45 nm) on the silicon substrate. Thereafter, 4% wt/vol of a resist solution dissolved in PF-7600 (3M) was spin-coated on the silicon substrate coated with the polymer-1 at 1,250 rpm for 60 seconds, and then heated at 80° C. for 1 minute to form a photoresist thin layer (a thickness of about 100 nm). Then, electron beam of 50 $\mu C/cm^2$ to 1,500 $\mu C/cm^2$ was irradiated under an acceleration voltage of 80 keV, and a developing process was performed for 5 seconds using PF-7600. As a result, a negative photoresist pattern having a line-width of 300 nm was formed. Afterwards, a thickness of the photoresist pattern was measured through Alpha-step®D-300 stylus profiler manufactured by Kla-Tencor. A solubility of the photoresist layer was evaluated using a difference between the thickness of the photoresist thin layer and the thickness of the photoresist pattern.

4) Evaluation of Solubility Change of Photoresist Layer on Substrate Coated with Polymer-3

2.5% wt/vol of a solution prepared by dissolving the copolymer (polymer-3) prepared according to Synthesis Example 3 in propylene glycol monomethyl ether acetate (PGMEA) was spin-coated on a silicon substrate at 2,000 rpm for 60 seconds, and then heated at 110° C. for 1 minute to coat the polymer-3 (a thickness of approximately 45 nm) on the silicon substrate. Thereafter, 4% wt/vol of a resist solution dissolved in PF-7600 (3M) was spin-coated on the substrate coated with polymer-3 at 1,250 rpm for 60 seconds, and then heated at 80° C. for 1 minute to form a photoresist thin layer (a thickness of about 100 nm). Then, electron beam of 50 $\mu C/cm^2$ to 1,500 $\mu C/cm^2$ was irradiated under an acceleration voltage of 80 keV, and a developing process was performed for 5 seconds using PF-7600. As a result, a negative photoresist pattern having a line-width of 300 nm was formed. Afterwards, a thickness of the photoresist pattern was measured through Alpha-step®D-300 stylus profiler manufactured by Kla-Tencor. A solubility of the photoresist layer was evaluated using a difference between the thickness of the photoresist thin layer and the thickness of the photoresist pattern.

FIG. 17 illustrates results of Experimental Example 6. Referring to FIG. 17, in a case of the untreated silicon substrate (bare), when electron beam of 488 $\mu C/cm^2$ was irradiated onto the photoresist thin layer, the thickness of the photoresist pattern was capable of being maintained at about 50% of the thickness of the photoresist thin layer. In a case of the substrate coated with HMDS, when electron beam of 496 $\mu C/cm^2$ was irradiated onto the photoresist thin layer, the thickness of the photoresist pattern was capable of being maintained at about 50% of the thickness of the photoresist thin layer. In a case of the substrate coated with the polymer-1, when electron beam of 466 $\mu C/cm^2$ was irradiated onto the photoresist thin layer, the thickness of the photoresist pattern was capable of being maintained at about 50% of the thickness of the photoresist thin layer. In a case of the substrate coated with the polymer-3, when electron beam of 445 $\mu C/cm^2$ was irradiated onto the photoresist thin layer, the thickness of the photoresist pattern was capable of being maintained at about 50% of the thickness of the photoresist thin layer. That is, in the case of the substrate coated with the polymer-1 and the polymer-3, the negative photoresist patterns were capable of being formed using a relatively smaller amount of electron beam irradiation.

According to the inventive concept, the resist composition of the photoresist layer may include the fluorinated alkyl group, and the underlayer composition of the underlayer may include the vinyl group ($—CH═CH_2$) or the first functional group capable of chemically combining with the fluorinated radical formed when the fluorinated alkyl group of the resist composition is exposed to the electron beam or extreme ultraviolet. Due to the cross-linking of the fluorinated alkyl groups of the resist composition during the exposure process, the photoresist layer may include the first portion and the second portion having different solubility, and the developing process of the photoresist layer may be performed using the difference in the solubility. Accordingly, the resolution and sensitivity of the photoresist pattern may be improved. In addition, the photoresist pattern may be fixed on the underlayer through the chemically combining with the underlayer. Accordingly, the collapse of the photoresist pattern may be suppressed.

The above description of embodiments of the inventive concept provides an example for explaining the inventive concept. Therefore, the technical spirit of the inventive concept is not limited to the above-described embodiments, but it is clear that various modifications and changes may be made by those skilled in the art within the technical scope of the inventive concept.

What is claimed is:

1. A underlayer composition for photolithography comprising:

a copolymer, wherein the copolymer includes a first repeating unit having a first functional group and a second repeating unit having a second functional group, wherein the first functional group is represented by one of Chemical Formulas 1 to 4,

[Chemical Formula 1]

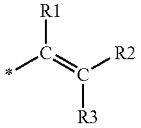

[Chemical Formula 2]

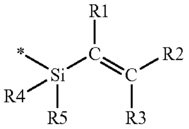

[Chemical Formula 3]

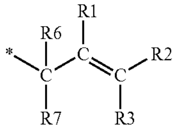

[Chemical Formula 4]

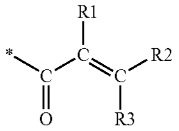

In Chemical Formulas 1 to 4, "R1", "R2", "R3", "R4", "R5", "R6", and "R7" are each independently hydrogen, deuterium, or an alkyl group having 1 to 3 carbon atoms, and "*" is a part bonded to the first repeating unit of the copolymer, wherein the second functional group is one of —NH—, —OH, $—OCH_3$, —COOH, and —SH, and wherein the first repeating unit and the second repeating unit are derived from a first monomer.

2. The underlayer composition for the photolithography of claim 1, wherein the copolymer further includes a third repeating unit, and wherein the third repeating unit is derived from a second monomer different from the first monomer.

3. The underlayer composition for the photolithography of claim 1, wherein the first repeating unit includes a structure represented by one of Chemical Formulas 5-1 to 5-20, and wherein, in the following Chemical Formulas 5-1 to 5-20, "M" is the first functional group,

[Chemical Formula 5-1]
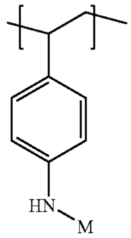
[Chemical Formula 5-2]
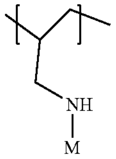
[Chemical Formula 5-3]
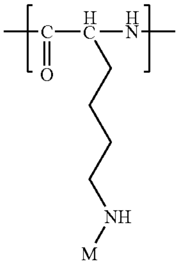
[Chemical Formula 5-4]
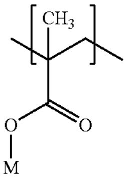
[Chemical Formula 5-5]
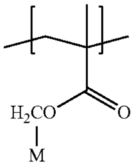
[Chemical Formula 5-6]
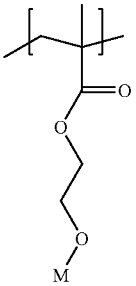
[Chemical Formula 5-7]
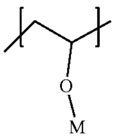
-continued
[Chemical Formula 5-8]
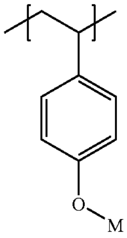
[Chemical Formula 5-9]
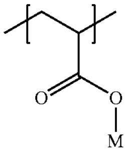
[Chemical Formula 5-10]
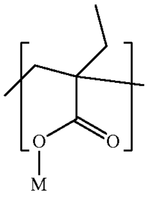
[Chemical Formula 5-11]
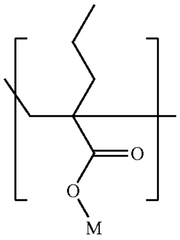
[Chemical Formula 5-12]
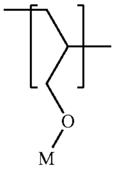
[Chemical Formula 5-13]
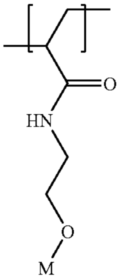
[Chemical Formula 5-14]
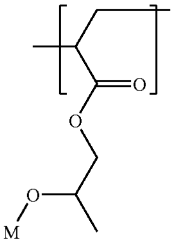

-continued

[Chemical Formula 5-15]

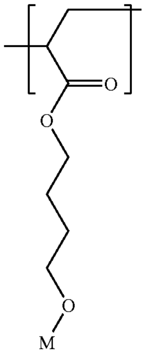

[Chemical Formula 5-16]

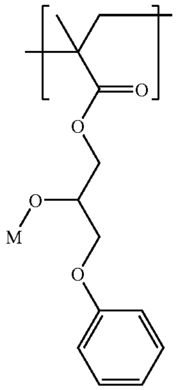

[Chemical Formula 5-17]

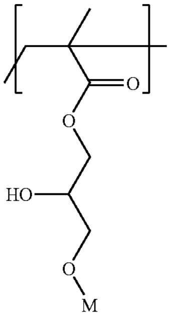

[Chemical Formula 5-18]

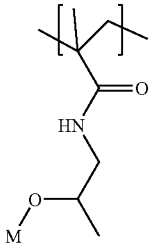

[Chemical Formula 5-19]

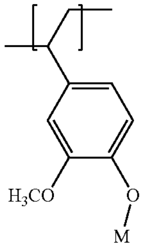

-continued

[Chemical Formula 5-20]

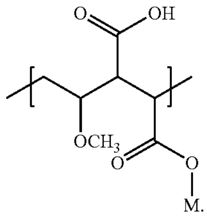

4. The underlayer composition for the photolithography of claim 3, wherein the second repeating unit includes a structure represented by one of Chemical Formulas 6-1 to 6-20,

[Chemical Formula 6-1]

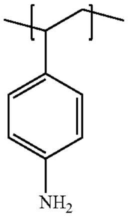

[Chemical Formula 6-2]

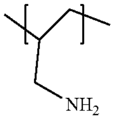

[Chemical Formula 6-3]

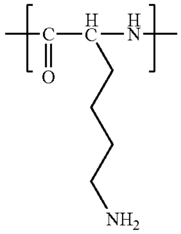

[Chemical Formula 6-4]

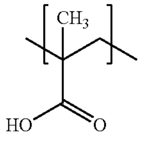

[Chemical Formula 6-5]

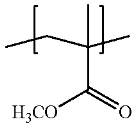

[Chemical Formula 6-6]

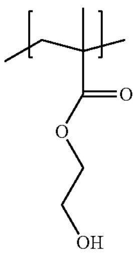

-continued
[Chemical Formula 6-7]
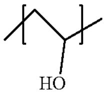
[Chemical Formula 6-8]
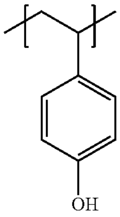
[Chemical Formula 6-9]
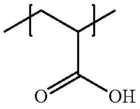
[Chemical Formula 6-10]
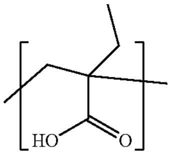
[Chemical Formula 6-11]
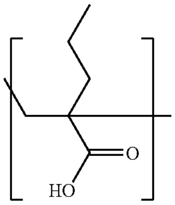
[Chemical Formula 6-12]
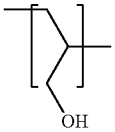
[Chemical Formula 6-13]
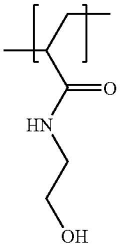
[Chemical Formula 6-14]
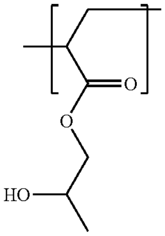
-continued
[Chemical Formula 6-15]
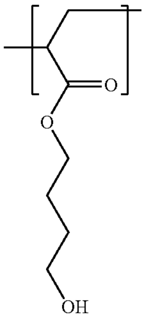
[Chemical Formula 6-16]
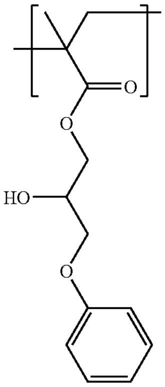
[Chemical Formula 6-17]
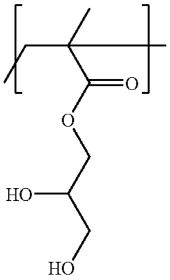
[Chemical Formula 6-18]
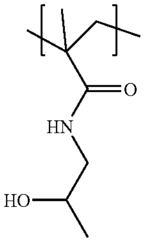
[Chemical Formula 6-19]
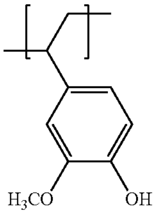

-continued

[Chemical Formula 6-20]

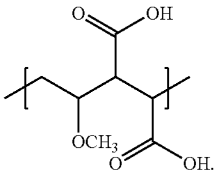

5. The underlayer composition for the photolithography of claim 1, wherein the first repeating unit includes a structure represented by Chemical Formula 5-8, and the second repeating unit includes a structure represented by Chemical Formula 6-8,

[Chemical Formula 5-8]

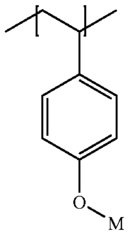

In Formula 5-8, "M" is the first functional group.

[Chemical Formula 6-8]

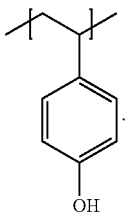

6. The underlayer composition for the photolithography of claim 5, wherein the copolymer further includes a third repeating unit, and wherein the third repeating unit includes a structure represented by one of Chemical Formulas 7-1 to 7-4,

[Chemical Formula 7-1]

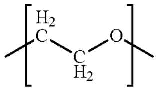

[Chemilca Formula 7-2]

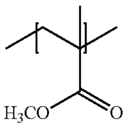

[Chemical Formula 7-3]

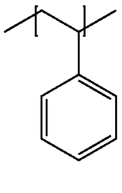

-continued

[Chemical Formula 7-4]

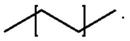

7. A multilayered structure comprising:

a lower layer;

an underlayer on the lower layer; and a photoresist layer on the underlayer, wherein the photoresist layer includes fluorinated alkyl groups, wherein the underlayer includes a monomolecule having a vinyl group (—CH═$CH_2$), or a copolymer including a first repeating unit having a first functional group, wherein the first functional group is represented by one of Chemical Formulas 1 to 4,

[Chemical Formula 1]

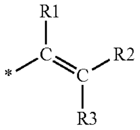

[Chemical Formula 2]

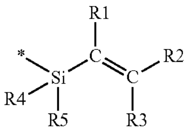

[Chemical Formula 3]

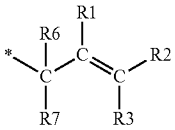

[Chemical Formula 4]

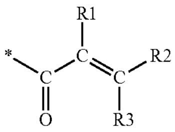

in Chemical Formulas 1 to 4, "R1", "R2", "R3", "R4", "R5", "R6", and "R7" are each independently hydrogen, deuterium, or an alkyl group having 1 to 3 carbon atoms, and "*" is a part bonded to the first repeating unit of the copolymer, wherein the photoresist layer includes a first portion having a structure in which the fluorinated alkyl groups are crosslinked with each other, wherein the fluorinated alkyl group in the first portion of the photoresist layer is bonded with the vinyl group of the monomolecule or the first functional group of the copolymer in the underlayer, through a covalent bond.

8. The multilayered structure of claim 7, wherein the underlayer includes at least one selected from the group consisting of 1,3-divinyltetramethyldisilazane (DVS), vinyltrimethoxysilane (VTMS), vinyltrimethoxysilane, vinyltrichlorosilane, vinylmethyldichlorosilane, vinyldimethylchlorosilane, tris(2-methoxyethoxy)(vinyl)silane, 3-(methacryloyloxy)propyltrimethoxysilane, 3-(acryloyloxy)propyltrimethoxysilane, trimethoxy(4-vinylphenyl)silane, 3-methacryloyloxy)propylmethyldiethoxysilane, and 3-(methacryloyloxy)propylmethyldiethoxysilane.

9. The multilayered structure of claim 7, wherein the copolymer includes the first repeating unit having the first functional group, and a second repeating unit having a second functional group, and wherein the second functional group is one of —NH—, —OH, —$OCH_3$, —COOH, and —SH.

10. The multilayered structure of claim 9, wherein the first repeating unit includes a structure represented by one of Chemical Formulas 5-1 to 5-20, and wherein, in the following Chemical Formulas 5-1 to 5-20, "M" is the first functional group,

[Chemical Formula 5-1]

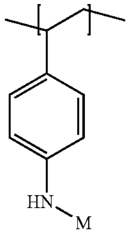

[Chemical Formula 5-2]

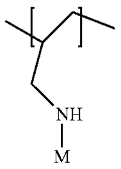

[Chemical Formula 5-3]

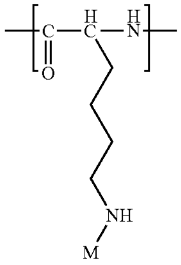

[Chemical Formula 5-4]

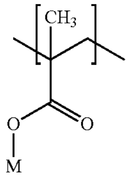

[Chemical Formula 5-5]

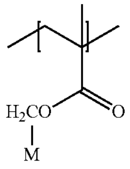

[Chemical Formula 5-6]

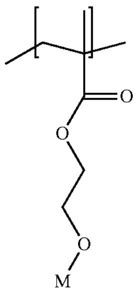

-continued

[Chemical Formula 5-7]

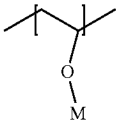

[Chemical Formula 5-8]

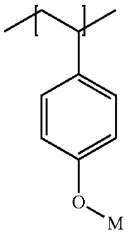

[Chemical Formula 5-9]

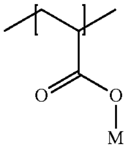

[Chemical Formula 5-10]

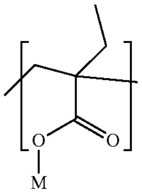

[Chemical Formula 5-11]

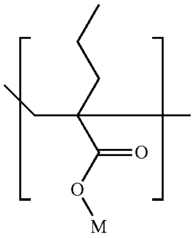

[Chemical Formula 5-12]

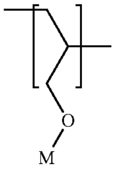

[Chemical Formula 5-13]

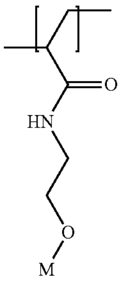

-continued

[Chemical Formula 5-14]

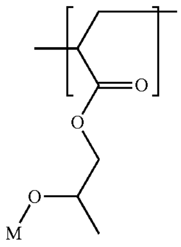

[Chemical Formula 5-15]

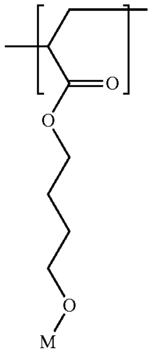

[Chemical Formula 5-16]

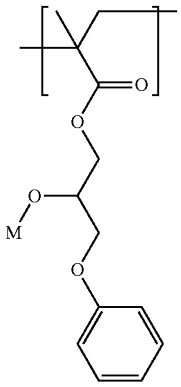

[Chemical Formula 5-17]

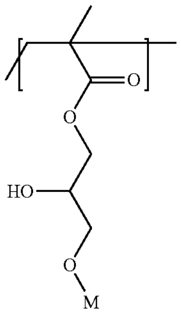

[Chemical Formula 5-18]

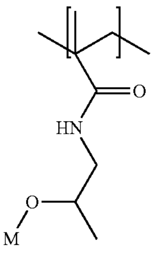

-continued

[Chemical Formula 5-19]

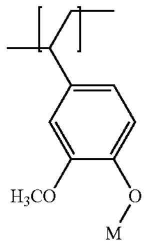

[Chemical Formula 5-20]

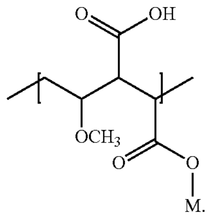

11. The multilayered structure of claim 10, wherein the second repeating unit includes a structure represented by one of Chemical Formulas 6-1 to 6-20,

[Chemical Formula 6-1]

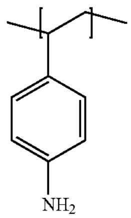

[Chemical Formula 6-2]

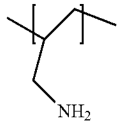

[Chemical Formula 6-3]

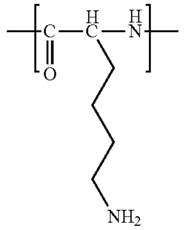

[Chemical Formula 6-4]

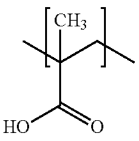

[Chemical Formula 6-5]

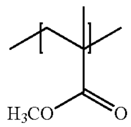

-continued
[Chemical Formula 6-6]
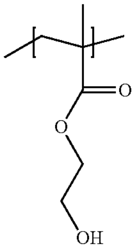
[Chemical Formula 6-7]
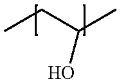
[Chemical Formula 6-8]
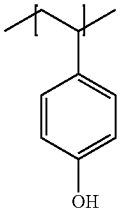
[Chemical Formula 6-9]
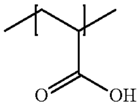
[Chemical Formula 6-10]
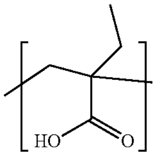
[Chemical Formula 6-11]
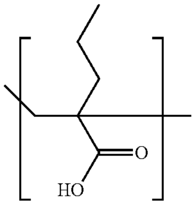
[Chemical Formula 6-12]
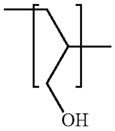
[Chemical Formula 6-13]
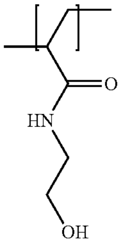
-continued
[Chemical Formula 6-14]
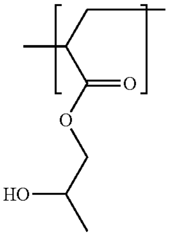
[Chemical Formula 6-15]
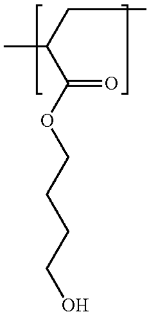
[Chemical Formula 6-16]
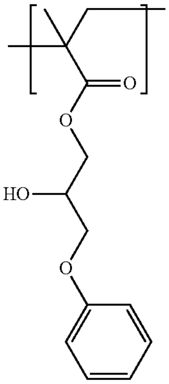
[Chemical Formula 6-17]
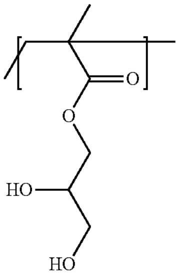
[Chemical Formula 6-18]
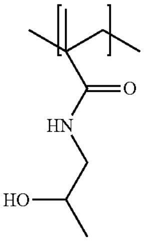

-continued

[Chemical Formula 6-19]

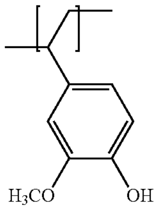

[Chemical Formula 6-20]

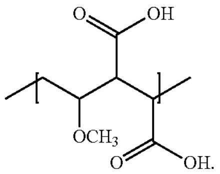

12. The multilayered structure of claim 9, wherein the copolymer further includes a third repeating unit, and wherein the third repeating unit is derived from a monomer different from the first repeating unit and the second repeating unit.

13. A method of manufacturing a semiconductor device, the method comprising:

forming an underlayer on a lower layer;

forming a photoresist layer on the underlayer; and performing an exposure process on the photoresist layer, wherein the forming of the underlayer includes applying an underlayer composition on the lower layer, wherein the forming of the photoresist layer includes applying a resist composition containing fluorinated alkyl groups on the underlayer using a fluorine-based solvent, wherein the underlayer composition includes a monomolecule having a vinyl group ($—CH=CH_2$), or a copolymer including a first repeating unit having a first functional group, wherein the first functional group is represented by one of Chemical Formulas 1 to 4,

[Chemical Formula 1]

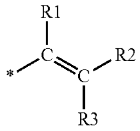

-continued

[Chemical Formula 2]

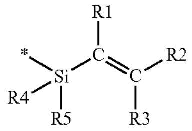

[Chemical Formula 3]

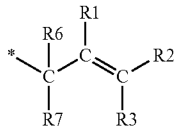

[Chemical Formula 4]

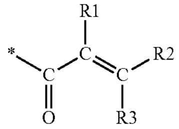

In Chemical Formulas 1 to 4, "R1", "R2", "R3", "R4", "R5", "R6", and "R7" are each independently hydrogen, deuterium, or an alkyl group having 1 to 3 carbon atoms, and "*" is a part bonded to the first repeating unit of the copolymer, wherein the photoresist layer includes a first portion exposed by the exposure process, and a second portion not exposed by the exposure process, wherein the first portion has a structure in which the fluorinated alkyl groups are crosslinked with each other, and wherein the fluorinated alkyl group in the first portion of the photoresist layer is bonded with the vinyl group of the monomolecule or the first functional group of the copolymer in the underlayer, through a covalent bond.

14. The method of claim 13, wherein the exposure process is performed using extreme ultraviolet.

15. The method of claim 13, further comprising performing a developing process to selectively remove the second portion of the photoresist layer, wherein the developing process is performed using a fluorine-based solvent.

* * * * *